(12) United States Patent
Uzoh

(10) Patent No.: US 12,211,809 B2
(45) Date of Patent: Jan. 28, 2025

(54) STRUCTURE WITH CONDUCTIVE FEATURE AND METHOD OF FORMING SAME

(71) Applicant: ADEIA SEMICONDUCTOR BONDING TECHNOLOGIES INC., San Jose, CA (US)

(72) Inventor: Cyprian Emeka Uzoh, San Jose, CA (US)

(73) Assignee: ADEIA SEMICONDUCTOR BONDING TECHNOLOGIES INC., San Jose, CA (US)

( * ) Notice: Subject to any disclaimer, the term of this patent is extended or adjusted under 35 U.S.C. 154(b) by 0 days.

(21) Appl. No.: 17/564,550

(22) Filed: Dec. 29, 2021

(65) Prior Publication Data
US 2022/0208702 A1 Jun. 30, 2022

Related U.S. Application Data

(60) Provisional application No. 63/132,334, filed on Dec. 30, 2020.

(51) Int. Cl.
*H01L 23/00* (2006.01)
(52) U.S. Cl.
CPC .............. *H01L 24/05* (2013.01); *H01L 24/03* (2013.01); *H01L 24/08* (2013.01);
(Continued)
(58) Field of Classification Search
CPC ..................... H01L 24/05; H01L 24/08; H01L 2224/08145; H01L 2224/8034;
(Continued)

(56) References Cited

U.S. PATENT DOCUMENTS 3,214,827 A 11/1965 Phohofsky
3,766,439 A 10/1973 Isaacson
(Continued)

FOREIGN PATENT DOCUMENTS

CN 1112286 A 11/1995
CN 1942057 A 4/2007
(Continued)

OTHER PUBLICATIONS

Akolkar, R., "Current status and advances in Damascene Electrodeposition," Encyclopedia of Interfacial Chemistry: Surface Science and Electrochemistry, 2017, 8 pages.
(Continued)

*Primary Examiner* — Mamadou L Diallo
(74) *Attorney, Agent, or Firm* — Knobbe, Martens, Olson & Bear, LLP

(57) ABSTRACT

An element is disclosed. The element can include a non-conductive structure having a non-conductive bonding surface, a cavity at least partially extending through a portion of a thickness of the non-conductive structure from the non-conductive bonding surface, and a conductive pad disposed in the cavity. The cavity has a bottom side and a sidewall. The conductive pad has a bonding surface and a back side opposite the bonding surface. An average size of the grains at the bonding surface is smaller than an average size of the grains adjacent the bottom side of the cavity. The conductive pad can include a crystal structure with grains oriented along a 111 crystal plane. The element can be bonded to another element to form a bonded structure. The element and the other element can be directly bonded to one another without an intervening adhesive.

33 Claims, 6 Drawing Sheets

(52) U.S. Cl.
CPC ............... *H01L 2224/0311* (2013.01); *H01L 2224/03848* (2013.01); *H01L 2224/05647* (2013.01); *H01L 2224/08145* (2013.01)

(58) Field of Classification Search
CPC . H01L 2224/05647; H01L 2224/80906; H01L 2224/80948
See application file for complete search history.

(56) References Cited

U.S. PATENT DOCUMENTS

| | | | |
|---|---|---|---|
| 3,775,844 A | 12/1973 | Parks | |
| 3,873,889 A | 3/1975 | Leyba | |
| 4,225,900 A | 9/1980 | Ciccio et al. | |
| 4,567,543 A | 1/1986 | Miniet | |
| 4,576,543 A | 3/1986 | Kuchyt et al. | |
| 4,695,870 A | 9/1987 | Patraw | |
| 4,716,049 A | 12/1987 | Patraw | |
| 4,781,601 A | 11/1988 | Kuhl et al. | |
| 4,804,132 A | 2/1989 | DiFrancesco | |
| 4,818,728 A | 4/1989 | Rai et al. | |
| 4,902,600 A | 2/1990 | Tamagawa et al. | |
| 4,924,353 A | 5/1990 | Patraw | |
| 4,939,568 A | 7/1990 | Kato et al. | |
| 4,941,033 A | 7/1990 | Kishida | |
| 4,975,079 A | 12/1990 | Beaman et al. | |
| 4,982,265 A | 1/1991 | Watanabe et al. | |
| 4,991,290 A | 2/1991 | MacKay | |
| 4,998,665 A | 3/1991 | Hayashi | |
| 5,046,238 A | 9/1991 | Daigle et al. | |
| 5,068,714 A | 11/1991 | Seipler | |
| 5,083,697 A | 1/1992 | DiFrancesco | |
| 5,087,585 A | 2/1992 | Hayashi | |
| 5,116,456 A | 5/1992 | Nestor | |
| 5,116,459 A | 5/1992 | Kordus et al. | |
| 5,117,282 A | 5/1992 | Salatino | |
| 5,130,779 A | 7/1992 | Agarwala et al. | |
| 5,138,438 A | 8/1992 | Masayuki et al. | |
| 5,148,265 A | 9/1992 | Khandros et al. | |
| 5,148,266 A | 9/1992 | Khandros et al. | |
| 5,172,303 A | 12/1992 | Bemardoni et al. | |
| 5,189,505 A | 2/1993 | Bartelink | |
| 5,196,726 A | 3/1993 | Nishiguchi et al. | |
| 5,198,888 A | 3/1993 | Sugano et al. | |
| 5,214,308 A | 5/1993 | Nishiguchi et al. | |
| 5,220,448 A | 6/1993 | Vogel et al. | |
| 5,220,488 A | 6/1993 | Denes | |
| 5,222,014 A | 6/1993 | Lin | |
| 5,224,023 A | 6/1993 | Smith et al. | |
| 5,236,118 A | 8/1993 | Bower et al. | |
| 5,247,423 A | 9/1993 | Lin et al. | |
| 5,251,806 A | 10/1993 | Agarwala et al. | |
| 5,281,852 A | 1/1994 | Normington | |
| 5,313,416 A | 5/1994 | Kimura | |
| 5,322,593 A | 6/1994 | Hasegawa et al. | |
| 5,324,892 A | 6/1994 | Granier et al. | |
| 5,334,804 A | 8/1994 | Love et al. | |
| 5,334,875 A | 8/1994 | Sugano et al. | |
| 5,341,564 A | 8/1994 | Akhavain et al. | |
| 5,345,205 A | 9/1994 | Kornrumpf | |
| 5,347,159 A | 9/1994 | Khandros et al. | |
| 5,390,844 A | 2/1995 | DiStefano et al. | |
| 5,394,303 A | 2/1995 | Yamaji | |
| 5,397,916 A | 3/1995 | Normington | |
| 5,397,997 A | 3/1995 | Tuckerman et al. | |
| 5,398,863 A | 3/1995 | Grube et al. | |
| 5,409,865 A | 4/1995 | Kamezos | |
| 5,413,952 A | 5/1995 | Pages et al. | |
| 5,422,435 A | 6/1995 | Takiar et al. | |
| 5,426,563 A | 6/1995 | Moresco et al. | |
| 5,440,171 A | 8/1995 | Miyano et al. | |
| 5,442,235 A | 8/1995 | Parrillo et al. | |
| 5,448,511 A | 9/1995 | Paurus et al. | |
| 5,454,160 A | 10/1995 | Nickel | |
| 5,455,390 A | 10/1995 | DiStefano et al. | |
| 5,455,740 A | 10/1995 | Burns | |
| 5,457,879 A | 10/1995 | Gurtler et al. | |
| 5,466,635 A | 11/1995 | Lynch et al. | |
| 5,479,318 A | 12/1995 | Burns | |
| 5,489,749 A | 2/1996 | DiStefano et al. | |
| 5,489,804 A | 2/1996 | Pasch | |
| 5,491,302 A | 2/1996 | DiStefano et al. | |
| 5,501,003 A | 3/1996 | Bernstein | |
| 5,503,704 A | 4/1996 | Bower et al. | |
| 5,516,727 A | 5/1996 | Broom | |
| 5,518,964 A | 5/1996 | DiStefano et al. | |
| 5,536,909 A | 7/1996 | DiStefano et al. | |
| 5,539,153 A | 7/1996 | Schwiebert et al. | |
| 5,541,525 A | 7/1996 | Wood et al. | |
| 5,552,963 A | 9/1996 | Burns | |
| 5,587,342 A | 12/1996 | Lin et al. | |
| 5,610,431 A | 3/1997 | Martin | |
| 5,615,824 A | 4/1997 | Fjelstad et al. | |
| 5,640,052 A | 6/1997 | Tsukamoto | |
| 5,646,446 A | 7/1997 | Nicewarner, Jr. et al. | |
| 5,656,550 A | 8/1997 | Tsuji et al. | |
| 5,659,952 A | 8/1997 | Kovac et al. | |
| 5,679,977 A | 10/1997 | Khandros et al. | |
| 5,689,091 A | 11/1997 | Hamzehdoost et al. | |
| 5,696,406 A | 12/1997 | Ueno | |
| 5,717,556 A | 2/1998 | Yanagida | |
| 5,731,709 A | 3/1998 | Pastore et al. | |
| 5,734,199 A | 3/1998 | Kawakita et al. | |
| 5,739,585 A | 4/1998 | Akram et al. | |
| 5,753,536 A | 5/1998 | Sugiyama et al. | |
| 5,762,845 A | 6/1998 | Crumly | |
| 5,771,555 A | 6/1998 | Eda et al. | |
| 5,776,797 A | 7/1998 | Nicewarner, Jr. et al. | |
| 5,777,386 A | 7/1998 | Higashi et al. | |
| 5,786,271 A | 7/1998 | Ohida et al. | |
| 5,789,815 A | 8/1998 | Tessier et al. | |
| 5,798,286 A | 8/1998 | Faraci et al. | |
| 5,802,699 A | 9/1998 | Fjelstad et al. | |
| 5,805,422 A | 9/1998 | Otake et al. | |
| 5,811,982 A | 9/1998 | Beaman et al. | |
| 5,821,692 A | 10/1998 | Rogers et al. | |
| 5,854,507 A | 12/1998 | Miremadi et al. | |
| 5,861,666 A | 1/1999 | Bellaar | |
| 5,866,942 A | 2/1999 | Suzuki et al. | |
| 5,956,234 A | 9/1999 | Mueller | |
| 5,973,391 A | 10/1999 | Bischoff et al. | |
| 5,980,270 A | 11/1999 | Fjelstad et al. | |
| 5,985,692 A | 11/1999 | Poenisch et al. | |
| 5,985,739 A | 11/1999 | Plettner et al. | |
| 5,998,808 A | 12/1999 | Matsushita | |
| 6,001,671 A | 12/1999 | Fjelstad | |
| 6,008,126 A | 12/1999 | Leedy | |
| 6,032,359 A | 3/2000 | Carroll | |
| 6,052,287 A | 4/2000 | Palmer et al. | |
| 6,054,756 A | 4/2000 | DiStefano et al. | |
| 6,059,984 A | 5/2000 | Cohen et al. | |
| 6,061,245 A | 5/2000 | Ingraham et al. | |
| 6,063,968 A | 5/2000 | Hubner et al. | |
| 6,071,761 A | 6/2000 | Jacobs | |
| 6,080,640 A | 6/2000 | Gardner et al. | |
| 6,097,096 A | 8/2000 | Gardner et al. | |
| 6,117,784 A | 9/2000 | Uzoh | |
| 6,123,825 A | 9/2000 | Uzoh et al. | |
| 6,147,000 A | 11/2000 | You et al. | |
| 6,157,075 A | 12/2000 | Karavakis et al. | |
| 6,175,159 B1 | 1/2001 | Sasaki et al. | |
| 6,177,636 B1 | 1/2001 | Fjelstad et al. | |
| 6,202,297 B1 | 3/2001 | Faraci et al. | |
| 6,216,941 B1 | 4/2001 | Yokoyama et al. | |
| 6,217,972 B1 | 4/2001 | Beroz et al. | |
| 6,218,302 B1 | 4/2001 | Braeckelmann et al. | |
| 6,229,220 B1 | 5/2001 | Saitoh et al. | |
| 6,232,150 B1 | 5/2001 | Lin et al. | |
| 6,235,996 B1 | 5/2001 | Farooq et al. | |
| 6,258,625 B1 | 7/2001 | Brofman et al. | |
| 6,259,160 B1 | 7/2001 | Lopatin et al. | |
| 6,265,775 B1 | 7/2001 | Seyyedy | |
| 6,297,072 B1 | 10/2001 | Tilmans et al. | |
| 6,300,679 B1 | 10/2001 | Mukerji et al. | |

(56) References Cited

U.S. PATENT DOCUMENTS

| | | |
|---|---|---|
| 6,307,260 B1 | 10/2001 | Smith et al. |
| 6,316,786 B1 | 11/2001 | Mueller et al. |
| 6,322,903 B1 | 11/2001 | Siniaguine et al. |
| 6,326,555 B1 | 12/2001 | McCormack et al. |
| 6,329,594 B1 | 12/2001 | Sturcken |
| 6,330,272 B1 | 12/2001 | Lomp |
| 6,332,270 B2 | 12/2001 | Beaman et al. |
| 6,333,120 B1 | 12/2001 | DeHaven et al. |
| 6,333,206 B1 | 12/2001 | Ito et al. |
| 6,335,571 B1 | 1/2002 | Capote et al. |
| 6,348,709 B1 | 2/2002 | Graettinger et al. |
| 6,358,627 B2 | 3/2002 | Benenati et al. |
| 6,362,525 B1 | 3/2002 | Rahim |
| 6,374,770 B1 | 4/2002 | Lee |
| 6,396,155 B1 | 5/2002 | Nukiwa et al. |
| 6,409,904 B1 | 6/2002 | Uzoh et al. |
| 6,423,640 B1 | 7/2002 | Lee et al. |
| 6,455,785 B1 | 9/2002 | Sakurai et al. |
| 6,458,411 B1 | 10/2002 | Goossen et al. |
| 6,465,892 B1 | 10/2002 | Suga |
| 6,469,394 B1 | 10/2002 | Wong et al. |
| 6,495,914 B1 | 12/2002 | Sekine et al. |
| 6,514,847 B1 | 2/2003 | Ohsawa et al. |
| 6,515,355 B1 | 2/2003 | Jiang et al. |
| 6,522,018 B1 | 2/2003 | Tay et al. |
| 6,528,894 B1 | 3/2003 | Akram et al. |
| 6,545,228 B2 | 4/2003 | Hashimoto |
| 6,550,666 B2 | 4/2003 | Chew et al. |
| 6,552,436 B2 | 4/2003 | Burnette et al. |
| 6,555,917 B1 | 4/2003 | Heo |
| 6,555,918 B2 | 4/2003 | Masuda et al. |
| 6,560,117 B2 | 5/2003 | Moon |
| 6,578,754 B1 | 6/2003 | Tung |
| 6,579,744 B1 | 6/2003 | Jiang |
| 6,583,515 B1 | 6/2003 | James et al. |
| 6,589,813 B1 | 7/2003 | Park |
| 6,589,870 B1 | 7/2003 | Katoh et al. |
| 6,592,109 B2 | 7/2003 | Yamaguchi et al. |
| 6,600,224 B1 | 7/2003 | Farquhar et al. |
| 6,624,003 B1 | 9/2003 | Rice |
| 6,624,653 B1 | 9/2003 | Cram |
| 6,627,814 B1 | 9/2003 | Stark |
| 6,632,377 B1 | 10/2003 | Brusic et al. |
| 6,647,310 B1 | 11/2003 | Yi et al. |
| 6,648,213 B1 | 11/2003 | Patterson et al. |
| 6,660,564 B2 | 12/2003 | Brady |
| 6,664,637 B2 | 12/2003 | Jimarez et al. |
| 6,667,225 B2 | 12/2003 | Hau-Riege et al. |
| 6,681,982 B2 | 1/2004 | Tung |
| 6,734,539 B2 | 5/2004 | Degani et al. |
| 6,734,556 B2 | 5/2004 | Shibata |
| 6,767,819 B2 | 7/2004 | Lutz |
| 6,782,610 B1 | 8/2004 | Lijima et al. |
| 6,815,252 B2 | 11/2004 | Pendse |
| 6,822,336 B2 | 11/2004 | Kurita |
| 6,828,686 B2 | 12/2004 | Park |
| 6,837,979 B2 | 1/2005 | Uzoh et al. |
| 6,852,564 B2 | 2/2005 | Ohuchi et al. |
| 6,864,585 B2 | 3/2005 | Enquist |
| 6,869,750 B2 | 3/2005 | Zhang et al. |
| 6,870,274 B2 | 3/2005 | Huang et al. |
| 6,875,638 B2 | 4/2005 | Yoneda et al. |
| 6,887,769 B2 | 5/2005 | Kellar et al. |
| 6,888,255 B2 | 5/2005 | Murtuza et al. |
| 6,902,869 B2 | 6/2005 | Appelt et al. |
| 6,902,987 B1 | 6/2005 | Tong et al. |
| 6,906,418 B2 | 6/2005 | Hiatt et al. |
| 6,908,027 B2 | 6/2005 | Tolchinsky et al. |
| 6,909,194 B2 | 6/2005 | Farnworth et al. |
| 6,956,165 B1 | 10/2005 | Hata et al. |
| 6,962,835 B2 | 11/2005 | Tong et al. |
| 6,965,166 B2 | 11/2005 | Hikita et al. |
| 6,974,769 B2 | 12/2005 | Basol et al. |
| 6,992,379 B2 | 1/2006 | Alcoe et al. |
| 6,995,044 B2 | 2/2006 | Yoneda et al. |
| 6,995,469 B2 | 2/2006 | Hatakeyama |
| 7,043,831 B1 | 5/2006 | Farnworth et al. |
| 7,045,453 B2 | 5/2006 | Canaperi et al. |
| 7,078,811 B2 | 7/2006 | Suga |
| 7,105,980 B2 | 9/2006 | Abbott et al. |
| 7,109,063 B2 | 9/2006 | Jiang |
| 7,115,495 B2 | 10/2006 | Wark et al. |
| 7,125,789 B2 | 10/2006 | Tellkamp et al. |
| 7,126,212 B2 | 10/2006 | Enquist et al. |
| 7,176,043 B2 | 2/2007 | Haba et al. |
| 7,183,190 B2 | 2/2007 | Saijo et al. |
| 7,193,423 B1 | 3/2007 | Dalton et al. |
| 7,214,887 B2 | 5/2007 | Higashida et al. |
| 7,238,919 B2 | 7/2007 | Kaneko et al. |
| 7,247,508 B2 | 7/2007 | Higashitani et al. |
| 7,354,798 B2 | 4/2008 | Pogge et al. |
| 7,361,285 B2 | 4/2008 | Kim |
| 7,382,049 B2 | 6/2008 | Ho et al. |
| 7,449,099 B1 | 11/2008 | Mayer et al. |
| 7,485,968 B2 | 2/2009 | Enquist et al. |
| 7,569,935 B2 | 8/2009 | Fan |
| 7,598,613 B2 | 10/2009 | Tanida et al. |
| 7,745,943 B2 | 6/2010 | Haba et al. |
| 7,750,488 B2 | 7/2010 | Patti et al. |
| 7,803,693 B2 | 9/2010 | Trezza |
| 7,829,265 B2 | 11/2010 | Kitada et al. |
| 7,901,989 B2 | 3/2011 | Haba et al. |
| 7,911,805 B2 | 3/2011 | Haba |
| 7,998,335 B2 | 8/2011 | Feeney et al. |
| 8,039,966 B2 | 10/2011 | Yang et al. |
| 8,101,858 B2 | 1/2012 | Hannour et al. |
| 8,115,310 B2 | 2/2012 | Masumoto et al. |
| 8,168,532 B2 | 5/2012 | Haneda et al. |
| 8,183,127 B2 | 5/2012 | Patti et al. |
| 8,241,961 B2 | 8/2012 | Kim et al. |
| 8,242,600 B2 | 8/2012 | Yang et al. |
| 8,314,007 B2 | 11/2012 | Vaufredaz |
| 8,349,635 B1 | 1/2013 | Gan et al. |
| 8,377,798 B2 | 2/2013 | Peng et al. |
| 8,435,421 B2 | 5/2013 | Keleher et al. |
| 8,441,131 B2 | 5/2013 | Ryan |
| 8,476,146 B2 | 7/2013 | Chen et al. |
| 8,476,165 B2 | 7/2013 | Trickett et al. |
| 8,482,132 B2 | 7/2013 | Yang et al. |
| 8,501,537 B2 | 8/2013 | Sadaka et al. |
| 8,524,533 B2 | 9/2013 | Tong et al. |
| 8,580,607 B2 | 11/2013 | Haba |
| 8,620,164 B2 | 12/2013 | Heck et al. |
| 8,647,987 B2 | 2/2014 | Yang et al. |
| 8,697,493 B2 | 4/2014 | Sadaka |
| 8,716,105 B2 | 5/2014 | Sadaka et al. |
| 8,728,934 B2 | 5/2014 | Uzho et al. |
| 8,802,538 B1 | 8/2014 | Liu |
| 8,809,123 B2 | 8/2014 | Liu et al. |
| 8,841,002 B2 | 9/2014 | Tong |
| 8,988,299 B2 | 3/2015 | Kam et al. |
| 9,000,600 B2 | 4/2015 | Uzoh et al. |
| 9,028,755 B2 | 5/2015 | Itoh |
| 9,093,350 B2 | 7/2015 | Endo et al. |
| 9,123,703 B2 | 9/2015 | Uzoh et al. |
| 9,142,517 B2 | 9/2015 | Liu et al. |
| 9,147,650 B2 | 9/2015 | Hagimoto et al. |
| 9,171,756 B2 | 10/2015 | Enquist et al. |
| 9,184,125 B2 | 11/2015 | Enquist et al. |
| 9,224,704 B2 | 12/2015 | Landru |
| 9,230,941 B2 | 1/2016 | Chen et al. |
| 9,257,399 B2 | 2/2016 | Kuang et al. |
| 9,269,612 B2 | 2/2016 | Chen et al. |
| 9,299,736 B2 | 3/2016 | Chen et al. |
| 9,312,229 B2 | 4/2016 | Chen et al. |
| 9,318,385 B2 | 4/2016 | Uzoh et al. |
| 9,331,149 B2 | 5/2016 | Tong et al. |
| 9,337,235 B2 | 5/2016 | Chen et al. |
| 9,343,330 B2 | 5/2016 | Brusic et al. |
| 9,349,669 B2 | 5/2016 | Uzoh et al. |
| 9,368,866 B2 | 6/2016 | Yu |
| 9,385,024 B2 | 7/2016 | Tong et al. |
| 9,394,161 B2 | 7/2016 | Cheng et al. |
| 9,431,368 B2 | 8/2016 | Enquist et al. |

(56) References Cited

U.S. PATENT DOCUMENTS

| | | |
|---|---|---|
| 9,433,093 B2 | 8/2016 | Uzoh |
| 9,437,572 B2 | 9/2016 | Chen et al. |
| 9,443,796 B2 | 9/2016 | Chou et al. |
| 9,461,007 B2 | 10/2016 | Chun et al. |
| 9,496,239 B1 | 11/2016 | Edelstein et al. |
| 9,536,848 B2 | 1/2017 | England et al. |
| 9,559,081 B1 | 1/2017 | Lai et al. |
| 9,620,481 B2 | 4/2017 | Edelstein et al. |
| 9,633,971 B2 | 4/2017 | Uzoh |
| 9,656,852 B2 | 5/2017 | Cheng et al. |
| 9,666,573 B1 | 5/2017 | Sukekawa |
| 9,723,716 B2 | 8/2017 | Meinhold |
| 9,728,521 B2 | 8/2017 | Tsai et al. |
| 9,741,620 B2 | 8/2017 | Uzoh et al. |
| 9,799,587 B2 | 10/2017 | Fujii et al. |
| 9,852,988 B2 | 12/2017 | Enquist et al. |
| 9,881,882 B2 | 1/2018 | Hsu et al. |
| 9,893,004 B2 | 2/2018 | Yazdani |
| 9,899,442 B2 | 2/2018 | Katkar |
| 9,929,050 B2 | 3/2018 | Lin |
| 9,941,241 B2 | 4/2018 | Edelstein et al. |
| 9,941,243 B2 | 4/2018 | Kim et al. |
| 9,953,941 B2 | 4/2018 | Enquist |
| 9,960,142 B2 | 5/2018 | Chen et al. |
| 10,002,844 B1 | 6/2018 | Wang et al. |
| 10,026,605 B2 | 7/2018 | Doub et al. |
| 10,075,657 B2 | 9/2018 | Fahim et al. |
| 10,147,641 B2 | 12/2018 | Enquist et al. |
| 10,204,893 B2 | 2/2019 | Uzoh et al. |
| 10,262,963 B2 | 4/2019 | Enquist |
| 10,269,708 B2 | 4/2019 | Enquist et al. |
| 10,269,756 B2 | 4/2019 | Uzoh |
| 10,276,619 B2 | 4/2019 | Kao et al. |
| 10,276,909 B2 | 4/2019 | Huang et al. |
| 10,314,175 B2 | 6/2019 | Sato et al. |
| 10,418,277 B2 | 9/2019 | Cheng et al. |
| 10,434,749 B2 | 10/2019 | Tong et al. |
| 10,446,456 B2 | 10/2019 | Shen et al. |
| 10,446,487 B2 | 10/2019 | Huang et al. |
| 10,446,532 B2 | 10/2019 | Uzoh et al. |
| 10,508,030 B2 | 12/2019 | Katkar et al. |
| 10,515,913 B2 | 12/2019 | Katkar et al. |
| 10,522,499 B2 | 12/2019 | Enquist et al. |
| 10,535,626 B2 | 1/2020 | Uzoh et al. |
| 10,707,087 B2 | 7/2020 | Uzoh et al. |
| 10,721,822 B2 | 7/2020 | Sato et al. |
| 10,784,191 B2 | 9/2020 | Huang et al. |
| 10,790,262 B2 | 9/2020 | Uzoh et al. |
| 10,840,135 B2 | 11/2020 | Uzoh |
| 10,840,205 B2 | 11/2020 | Fountain, Jr. et al. |
| 10,854,578 B2 | 12/2020 | Morein |
| 10,879,212 B2 | 12/2020 | Uzoh et al. |
| 10,886,177 B2 | 1/2021 | DeLaCruz et al. |
| 10,886,250 B2 | 1/2021 | Uzoh |
| 10,892,246 B2 | 1/2021 | Uzoh |
| 10,908,173 B2 | 2/2021 | Yamasaki et al. |
| 10,923,408 B2 | 2/2021 | Huang et al. |
| 10,923,413 B2 | 2/2021 | DeLaCruz |
| 10,937,755 B2 | 3/2021 | Shah et al. |
| 10,950,547 B2 | 3/2021 | Mohammed et al. |
| 10,964,664 B2 | 3/2021 | Mandalapu et al. |
| 10,985,133 B2 | 4/2021 | Uzoh |
| 10,991,804 B2 | 4/2021 | DeLaCruz et al. |
| 10,998,292 B2 | 5/2021 | Lee et al. |
| 11,004,757 B2 | 5/2021 | Katkar et al. |
| 11,011,494 B2 | 5/2021 | Gao et al. |
| 11,011,503 B2 | 5/2021 | Wang et al. |
| 11,031,285 B2 | 6/2021 | Katkar et al. |
| 11,056,348 B2 | 7/2021 | Theil |
| 11,088,099 B2 | 8/2021 | Katkar et al. |
| 11,127,738 B2 | 9/2021 | DeLaCruz et al. |
| 11,158,606 B2 | 10/2021 | Gao et al. |
| 11,171,117 B2 | 11/2021 | Gao et al. |
| 11,176,450 B2 | 11/2021 | Teig et al. |
| 11,244,920 B2 | 2/2022 | Uzoh |
| 11,256,004 B2 | 2/2022 | Haba et al. |
| 11,264,357 B1 | 3/2022 | DeLaCruz et al. |
| 11,276,676 B2 | 3/2022 | Enquist et al. |
| 11,329,034 B2 | 5/2022 | Tao et al. |
| 11,348,898 B2 | 5/2022 | DeLaCruz et al. |
| 11,355,443 B2 | 6/2022 | Huang et al. |
| 11,515,279 B2 | 11/2022 | Uzoh et al. |
| 11,769,747 B2 * | 9/2023 | Sawada .................. H01L 24/32 257/751 |
| 11,973,056 B2 | 4/2024 | Uzoh |
| 12,027,487 B2 | 7/2024 | Uzoh |
| 2001/0008309 A1 | 7/2001 | Iijima et al. |
| 2001/0030061 A1 | 10/2001 | Yoneda |
| 2002/0000328 A1 | 1/2002 | Motomura et al. |
| 2002/0003307 A1 | 1/2002 | Suga |
| 2002/0025665 A1 | 2/2002 | Juengling |
| 2002/0033412 A1 | 3/2002 | Tung |
| 2002/0047208 A1 | 4/2002 | Uzoh et al. |
| 2002/0056906 A1 | 5/2002 | Kajiwara et al. |
| 2002/0074641 A1 | 6/2002 | Towle et al. |
| 2002/0074670 A1 | 6/2002 | Suga |
| 2002/0090756 A1 | 7/2002 | Tago et al. |
| 2002/0094661 A1 | 7/2002 | Enquist et al. |
| 2002/0125571 A1 | 9/2002 | Corisis et al. |
| 2002/0153602 A1 | 10/2002 | Tay et al. |
| 2002/0155661 A1 | 10/2002 | Massingill et al. |
| 2002/0185735 A1 | 12/2002 | Sakurai et al. |
| 2002/0190107 A1 | 12/2002 | Shah et al. |
| 2003/0001286 A1 | 1/2003 | Kajiwara et al. |
| 2003/0019568 A1 | 1/2003 | Liu et al. |
| 2003/0075791 A1 | 4/2003 | Shibata |
| 2003/0082846 A1 | 5/2003 | Yoneda et al. |
| 2003/0092220 A1 | 5/2003 | Akram |
| 2003/0094700 A1 | 5/2003 | Aiba et al. |
| 2003/0107118 A1 | 6/2003 | Pflughaupt et al. |
| 2003/0127734 A1 | 7/2003 | Lee et al. |
| 2003/0132518 A1 | 7/2003 | Castro |
| 2003/0157748 A1 | 8/2003 | Kim et al. |
| 2003/0164540 A1 | 9/2003 | Lee et al. |
| 2003/0189260 A1 | 10/2003 | Tong et al. |
| 2003/0196833 A1 | 10/2003 | Fujii et al. |
| 2003/0234453 A1 | 12/2003 | Liu et al. |
| 2004/0031972 A1 | 2/2004 | Pflughaupt et al. |
| 2004/0052390 A1 | 3/2004 | Morales et al. |
| 2004/0052930 A1 | 3/2004 | Basol et al. |
| 2004/0084414 A1 | 5/2004 | Sakai et al. |
| 2004/0087057 A1 | 5/2004 | Wang et al. |
| 2004/0126927 A1 | 7/2004 | Lin et al. |
| 2004/0132533 A1 | 7/2004 | Leifer |
| 2004/0135243 A1 | 7/2004 | Aoyagi |
| 2004/0155358 A1 | 8/2004 | Iijima |
| 2004/0173900 A1 | 9/2004 | Chen et al. |
| 2004/0201096 A1 | 10/2004 | Iijima et al. |
| 2004/0224441 A1 | 11/2004 | Saito |
| 2004/0232533 A1 | 11/2004 | Hatakeyama |
| 2004/0235603 A1 | 11/2004 | Peck |
| 2004/0238492 A1 | 12/2004 | Catabay et al. |
| 2004/0238936 A1 | 12/2004 | Rumer et al. |
| 2004/0245213 A1 | 12/2004 | Fukase et al. |
| 2004/0262778 A1 | 12/2004 | Hua |
| 2005/0093164 A1 | 5/2005 | Standing |
| 2005/0097727 A1 | 5/2005 | Lijima et al. |
| 2005/0101136 A1 | 5/2005 | Mori |
| 2005/0116326 A1 | 6/2005 | Haba et al. |
| 2005/0121784 A1 | 6/2005 | Standing |
| 2005/0124091 A1 | 6/2005 | Fukase et al. |
| 2005/0133572 A1 | 6/2005 | Brese et al. |
| 2005/0150684 A1 | 7/2005 | Hashimoto |
| 2005/0194695 A1 | 9/2005 | Lin et al. |
| 2005/0266670 A1 | 12/2005 | Lin et al. |
| 2005/0274227 A1 | 12/2005 | Aggarwal et al. |
| 2005/0284658 A1 | 12/2005 | Kubota et al. |
| 2005/0285246 A1 | 12/2005 | Haba et al. |
| 2006/0024950 A1 | 2/2006 | Choi et al. |
| 2006/0055032 A1 | 3/2006 | Chang et al. |
| 2006/0057945 A1 | 3/2006 | Hsu et al. |
| 2006/0091538 A1 | 5/2006 | Kabadi |
| 2006/0138647 A1 | 6/2006 | Crisp et al. |
| 2006/0220197 A1 | 10/2006 | Kobrinsky et al. |

(56) References Cited

U.S. PATENT DOCUMENTS

| | | |
|---|---|---|
| 2006/0220259 A1 | 10/2006 | Chen et al. |
| 2006/0254502 A1 | 11/2006 | Garrou et al. |
| 2007/0017090 A1 | 1/2007 | Sakai et al. |
| 2007/0045869 A1 | 3/2007 | Ho et al. |
| 2007/0096294 A1 | 5/2007 | Ikeda et al. |
| 2007/0111386 A1 | 5/2007 | Kim et al. |
| 2007/0138649 A1 | 6/2007 | Knights |
| 2007/0141750 A1 | 6/2007 | Iwasaki et al. |
| 2007/0164447 A1 | 7/2007 | Ho et al. |
| 2007/0173900 A1 | 7/2007 | Siegel et al. |
| 2007/0209199 A1 | 9/2007 | Lijima et al. |
| 2007/0216012 A1 | 9/2007 | Hozoji et al. |
| 2007/0230153 A1 | 10/2007 | Tanida et al. |
| 2007/0232023 A1 | 10/2007 | Tong et al. |
| 2007/0292988 A1 | 12/2007 | Nakabayashi |
| 2008/0003402 A1 | 1/2008 | Haba et al. |
| 2008/0067661 A1 | 3/2008 | Kawabata |
| 2008/0073795 A1 | 3/2008 | Kohl et al. |
| 2008/0122092 A1 | 5/2008 | Hong |
| 2008/0138961 A1 | 6/2008 | Lee |
| 2008/0145607 A1 | 6/2008 | Kajiwara et al. |
| 2008/0220373 A1 | 9/2008 | Choi et al. |
| 2008/0237053 A1 | 10/2008 | Andricacos et al. |
| 2008/0251940 A1 | 10/2008 | Lee et al. |
| 2008/0258299 A1 | 10/2008 | Kang et al. |
| 2008/0268570 A1 | 10/2008 | Shen et al. |
| 2009/0002964 A1 | 1/2009 | Haba |
| 2009/0039507 A1 | 2/2009 | Funaki |
| 2009/0039528 A1 | 2/2009 | Haba et al. |
| 2009/0071707 A1 | 3/2009 | Endo et al. |
| 2009/0071837 A1 | 3/2009 | Fredenberg et al. |
| 2009/0091024 A1 | 4/2009 | Zeng et al. |
| 2009/0115047 A1 | 5/2009 | Haba et al. |
| 2009/0121348 A1 | 5/2009 | Chang |
| 2009/0146303 A1 | 6/2009 | Kwon |
| 2009/0148594 A1 | 6/2009 | Moran et al. |
| 2009/0188706 A1 | 7/2009 | Endo |
| 2009/0197408 A1 | 8/2009 | Lehr et al. |
| 2009/0200668 A1 | 8/2009 | Yang et al. |
| 2009/0243095 A1 | 10/2009 | Fujita et al. |
| 2009/0294056 A1 | 12/2009 | Yoshimura et al. |
| 2009/0302466 A1 | 12/2009 | Shoji et al. |
| 2010/0006987 A1 | 1/2010 | Murugan et al. |
| 2010/0044860 A1 | 2/2010 | Haba et al. |
| 2010/0052189 A1 | 3/2010 | Sakurai et al. |
| 2010/0093131 A1 | 4/2010 | Maeda |
| 2010/0102452 A1 | 4/2010 | Nakao |
| 2010/0164355 A1 | 7/2010 | Son et al. |
| 2010/0255262 A1 | 10/2010 | Chen et al. |
| 2010/0301485 A1 | 12/2010 | Sekine et al. |
| 2010/0327443 A1 | 12/2010 | Kim |
| 2011/0008632 A1 | 1/2011 | Zheng et al. |
| 2011/0012263 A1 | 1/2011 | Hata et al. |
| 2011/0074027 A1 | 3/2011 | Kwon |
| 2011/0074040 A1 | 3/2011 | Frank et al. |
| 2011/0084403 A1 | 4/2011 | Yang et al. |
| 2011/0278063 A1 | 11/2011 | Chen et al. |
| 2012/0025365 A1 | 2/2012 | Haba |
| 2012/0042515 A1 | 2/2012 | Shoji et al. |
| 2012/0211549 A1 | 8/2012 | Yamakami et al. |
| 2012/0211894 A1 | 8/2012 | Aoyagi |
| 2012/0212384 A1 | 8/2012 | Kam et al. |
| 2012/0217165 A1 | 8/2012 | Feng et al. |
| 2012/0248618 A1 | 10/2012 | Akino |
| 2012/0273936 A1 | 11/2012 | Uang et al. |
| 2012/0305298 A1 | 12/2012 | Uang et al. |
| 2013/0009321 A1 | 1/2013 | Kagawa et al. |
| 2013/0020704 A1 | 1/2013 | Sadaka |
| 2013/0040451 A1 | 2/2013 | Dragoi et al. |
| 2013/0099376 A1 | 4/2013 | Haba |
| 2013/0136917 A1 | 5/2013 | Dastoor et al. |
| 2013/0221527 A1 | 8/2013 | Yang et al. |
| 2013/0252399 A1 | 9/2013 | Leduc |
| 2013/0270328 A1 | 10/2013 | Di Cioccio et al. |
| 2013/0320556 A1 | 12/2013 | Liu et al. |
| 2014/0001636 A1 | 1/2014 | Saito et al. |
| 2014/0007351 A1 | 1/2014 | Cohen |
| 2014/0077351 A1 | 3/2014 | Haba |
| 2014/0153210 A1 | 6/2014 | Uzoh |
| 2014/0175655 A1 | 6/2014 | Chen et al. |
| 2014/0191418 A1 | 7/2014 | Cheng et al. |
| 2014/0225795 A1 | 8/2014 | Yu |
| 2014/0231996 A1 | 8/2014 | Fujisawa |
| 2014/0252635 A1 | 9/2014 | Tran et al. |
| 2014/0264948 A1 | 9/2014 | Chou et al. |
| 2014/0353828 A1 | 12/2014 | Edelstein et al. |
| 2015/0014399 A1 | 1/2015 | Ogashiwa et al. |
| 2015/0027755 A1 | 1/2015 | Tsujimoto et al. |
| 2015/0064498 A1 | 3/2015 | Tong |
| 2015/0108644 A1 | 4/2015 | Kuang et al. |
| 2015/0206823 A1 | 7/2015 | Lin et al. |
| 2015/0206840 A1* | 7/2015 | Lin .................. H01L 21/76877 |
| | | 257/734 |
| 2015/0245474 A1 | 8/2015 | Takahashi et al. |
| 2015/0279888 A1 | 10/2015 | Chen et al. |
| 2015/0340269 A1 | 11/2015 | Rivoire et al. |
| 2015/0357538 A1 | 12/2015 | Hsing Chen et al. |
| 2015/0364434 A1 | 12/2015 | Chen et al. |
| 2015/0380368 A1 | 12/2015 | Momose et al. |
| 2016/0020183 A1 | 1/2016 | Chuang et al. |
| 2016/0049384 A1 | 2/2016 | Lu et al. |
| 2016/0133598 A1 | 5/2016 | Baudin et al. |
| 2016/0168715 A1 | 6/2016 | Ma et al. |
| 2016/0190103 A1 | 6/2016 | Kabe et al. |
| 2016/0192496 A1 | 6/2016 | Wang et al. |
| 2016/0247778 A1 | 8/2016 | Katkar et al. |
| 2016/0276383 A1 | 9/2016 | Chuang et al. |
| 2016/0343682 A1 | 11/2016 | Kawasaki |
| 2017/0025381 A1* | 1/2017 | Tsai .................. H01L 21/76877 |
| 2017/0047307 A1 | 2/2017 | Uzoh |
| 2017/0069575 A1 | 3/2017 | Haba et al. |
| 2017/0086320 A1 | 3/2017 | Barber |
| 2017/0141079 A1 | 5/2017 | Kao et al. |
| 2017/0194271 A1 | 7/2017 | Hsu et al. |
| 2017/0271242 A1* | 9/2017 | Lo ..................... H01L 23/53242 |
| 2017/0330855 A1 | 11/2017 | Tung et al. |
| 2017/0355040 A1 | 12/2017 | Utsumi et al. |
| 2018/0151523 A1 | 5/2018 | Chen et al. |
| 2018/0175012 A1 | 6/2018 | Wu et al. |
| 2018/0182639 A1 | 6/2018 | Uzoh et al. |
| 2018/0182665 A1 | 6/2018 | Uzoh et al. |
| 2018/0182666 A1 | 6/2018 | Uzoh et al. |
| 2018/0190580 A1 | 7/2018 | Haba et al. |
| 2018/0190583 A1 | 7/2018 | DeLaCruz et al. |
| 2018/0190876 A1 | 7/2018 | Liu et al. |
| 2018/0219038 A1 | 8/2018 | Gambino et al. |
| 2018/0273377 A1 | 9/2018 | Katkar et al. |
| 2018/0295718 A1 | 10/2018 | Uzoh et al. |
| 2018/0323177 A1 | 11/2018 | Yu et al. |
| 2018/0323227 A1 | 11/2018 | Zhang et al. |
| 2018/0331066 A1 | 11/2018 | Uzoh et al. |
| 2018/0350674 A1* | 12/2018 | Uzoh .................. H01L 21/7684 |
| 2019/0096741 A1 | 3/2019 | Uzoh et al. |
| 2019/0115277 A1 | 4/2019 | Yu et al. |
| 2019/0131277 A1 | 5/2019 | Yang et al. |
| 2019/0198407 A1 | 6/2019 | Huang et al. |
| 2019/0198409 A1 | 6/2019 | Katkar et al. |
| 2019/0244909 A1* | 8/2019 | Chiu ................. H01L 23/49827 |
| 2019/0265411 A1 | 8/2019 | Huang et al. |
| 2019/0295954 A1 | 9/2019 | Nomura et al. |
| 2019/0319007 A1 | 10/2019 | Uzoh et al. |
| 2019/0333550 A1 | 10/2019 | Fisch |
| 2019/0348336 A1 | 11/2019 | Katkar et al. |
| 2019/0385935 A1 | 12/2019 | Gao et al. |
| 2019/0385966 A1 | 12/2019 | Gao et al. |
| 2019/0393086 A1 | 12/2019 | Uzoh |
| 2020/0006280 A1 | 1/2020 | Shah et al. |
| 2020/0013637 A1 | 1/2020 | Haba |
| 2020/0013765 A1 | 1/2020 | Fountain, Jr. et al. |
| 2020/0035641 A1 | 1/2020 | Fountain, Jr. et al. |
| 2020/0075520 A1 | 3/2020 | Gao et al. |
| 2020/0075534 A1* | 3/2020 | Gao ....................... H01L 24/02 |
| 2020/0075553 A1 | 3/2020 | DeLaCruz et al. |
| 2020/0098711 A1* | 3/2020 | Choi ................. H01L 27/14618 |

(56) References Cited

U.S. PATENT DOCUMENTS

| | | |
|---|---|---|
| 2020/0126906 A1 | 4/2020 | Uzoh et al. |
| 2020/0194396 A1* | 6/2020 | Uzoh ............... H01L 25/0657 |
| 2020/0227367 A1 | 7/2020 | Haba et al. |
| 2020/0243380 A1 | 7/2020 | Uzoh et al. |
| 2020/0279821 A1 | 9/2020 | Haba et al. |
| 2020/0294908 A1 | 9/2020 | Haba et al. |
| 2020/0328162 A1 | 10/2020 | Haba et al. |
| 2020/0328164 A1 | 10/2020 | DeLaCruz et al. |
| 2020/0328165 A1 | 10/2020 | DeLaCruz et al. |
| 2020/0335408 A1 | 10/2020 | Gao et al. |
| 2020/0365575 A1 | 11/2020 | Uzoh et al. |
| 2020/0371154 A1 | 11/2020 | DeLaCruz et al. |
| 2020/0381389 A1 | 12/2020 | Uzoh et al. |
| 2020/0395321 A1 | 12/2020 | Katkar et al. |
| 2020/0411483 A1 | 12/2020 | Uzoh et al. |
| 2021/0028136 A1 | 1/2021 | Said et al. |
| 2021/0028144 A1* | 1/2021 | Lu ......................... H01L 24/12 |
| 2021/0098411 A1 | 4/2021 | Liff et al. |
| 2021/0098412 A1 | 4/2021 | Haba et al. |
| 2021/0118864 A1 | 4/2021 | DeLaCruz et al. |
| 2021/0143125 A1 | 5/2021 | DeLaCruz et al. |
| 2021/0181510 A1 | 6/2021 | Katkar et al. |
| 2021/0193603 A1 | 6/2021 | Katkar et al. |
| 2021/0193624 A1 | 6/2021 | DeLaCruz et al. |
| 2021/0193625 A1 | 6/2021 | DeLaCruz et al. |
| 2021/0234070 A1 | 7/2021 | Brueck et al. |
| 2021/0242152 A1 | 8/2021 | Fountain, Jr. et al. |
| 2021/0296282 A1 | 9/2021 | Gao et al. |
| 2021/0305202 A1 | 9/2021 | Uzoh et al. |
| 2021/0335737 A1 | 10/2021 | Katkar et al. |
| 2021/0366820 A1 | 11/2021 | Uzoh |
| 2021/0407941 A1 | 12/2021 | Haba |
| 2022/0077063 A1 | 3/2022 | Haba |
| 2022/0077087 A1 | 3/2022 | Haba |
| 2022/0130787 A1 | 4/2022 | Uzoh |
| 2022/0139867 A1 | 5/2022 | Uzoh |
| 2022/0139869 A1 | 5/2022 | Gao et al. |
| 2022/0149002 A1* | 5/2022 | Hou ..................... H01L 25/18 |
| 2022/0157752 A1 | 5/2022 | Bourjot et al. |
| 2022/0165692 A1 | 5/2022 | Uzoh et al. |
| 2022/0208650 A1 | 6/2022 | Gao et al. |
| 2022/0208723 A1 | 6/2022 | Katkar et al. |
| 2022/0246497 A1 | 8/2022 | Fountain, Jr. et al. |
| 2022/0285303 A1 | 9/2022 | Mirkarimi et al. |
| 2022/0319901 A1 | 10/2022 | Suwito et al. |
| 2022/0320035 A1 | 10/2022 | Uzoh et al. |
| 2022/0320036 A1 | 10/2022 | Gao et al. |
| 2023/0005849 A1 | 1/2023 | Chuang |
| 2023/0005850 A1 | 1/2023 | Fountain, Jr. |
| 2023/0019869 A1 | 1/2023 | Mirkarimi et al. |
| 2023/0036441 A1 | 2/2023 | Haba et al. |
| 2023/0067677 A1 | 3/2023 | Lee et al. |
| 2023/0069183 A1 | 3/2023 | Haba |
| 2023/0100032 A1 | 3/2023 | Haba et al. |
| 2023/0115122 A1 | 4/2023 | Uzoh et al. |
| 2023/0122531 A1 | 4/2023 | Uzoh |
| 2023/0123423 A1 | 4/2023 | Gao et al. |
| 2023/0125395 A1 | 4/2023 | Gao et al. |
| 2023/0130259 A1 | 4/2023 | Haba et al. |
| 2023/0132632 A1 | 5/2023 | Katkar et al. |
| 2023/0140107 A1 | 5/2023 | Uzoh et al. |
| 2023/0142680 A1 | 5/2023 | Guevara et al. |
| 2023/0154816 A1 | 5/2023 | Haba et al. |
| 2023/0154828 A1 | 5/2023 | Haba et al. |
| 2023/0187264 A1 | 6/2023 | Uzoh et al. |
| 2023/0187317 A1 | 6/2023 | Uzoh |
| 2023/0187412 A1 | 6/2023 | Gao et al. |
| 2023/0197453 A1 | 6/2023 | Fountain, Jr. et al. |
| 2023/0197496 A1 | 6/2023 | Theil |
| 2023/0197559 A1 | 6/2023 | Haba et al. |
| 2023/0197560 A1 | 6/2023 | Katkar et al. |
| 2023/0197655 A1 | 6/2023 | Theil et al. |
| 2023/0207402 A1 | 6/2023 | Fountain, Jr. et al. |
| 2023/0207437 A1 | 6/2023 | Haba |
| 2023/0207474 A1 | 6/2023 | Uzoh et al. |
| 2023/0207514 A1 | 6/2023 | Gao et al. |
| 2023/0215836 A1 | 7/2023 | Haba et al. |
| 2023/0245950 A1 | 8/2023 | Haba et al. |
| 2023/0268300 A1 | 8/2023 | Uzoh et al. |
| 2023/0268307 A1 | 8/2023 | Uzoh et al. |
| 2023/0299029 A1 | 9/2023 | Theil et al. |
| 2023/0343734 A1 | 10/2023 | Uzoh et al. |
| 2023/0360950 A1 | 11/2023 | Gao |
| 2023/0361074 A1 | 11/2023 | Uzoh et al. |
| 2023/0369136 A1 | 11/2023 | Uzoh et al. |
| 2023/0375613 A1 | 11/2023 | Haba et al. |
| 2024/0038702 A1 | 2/2024 | Uzoh |
| 2024/0055407 A1 | 2/2024 | Workman et al. |
| 2024/0079376 A1 | 3/2024 | Suwito et al. |
| 2024/0105674 A1 | 3/2024 | Uzoh et al. |
| 2024/0113059 A1 | 4/2024 | Uzoh et al. |
| 2024/0213191 A1 | 6/2024 | Theil et al. |
| 2024/0213210 A1 | 6/2024 | Haba et al. |
| 2024/0217210 A1 | 7/2024 | Zhao et al. |
| 2024/0222239 A1 | 7/2024 | Gao et al. |
| 2024/0222315 A1 | 7/2024 | Uzoh |
| 2024/0222319 A1 | 7/2024 | Gao et al. |
| 2024/0266255 A1 | 8/2024 | Haba et al. |

FOREIGN PATENT DOCUMENTS

| | | | |
|---|---|---|---|
| CN | 101002313 A | 7/2007 | |
| CN | 203013712 U | 6/2013 | |
| CN | 103531492 A * | 1/2014 | ............. H01L 21/02 |
| CN | 106711131 A * | 5/2017 | ........... H01L 23/481 |
| CN | 107256852 B | 9/2019 | |
| DE | 102006006825 A1 | 8/2007 | |
| EP | 0615283 A1 | 9/1994 | |
| EP | 1091406 A2 | 4/2001 | |
| EP | 1255295 A1 | 11/2002 | |
| EP | 1387402 A2 | 2/2004 | |
| EP | 1471570 A1 | 10/2004 | |
| EP | 1602749 | 12/2005 | |
| JP | 54148484 | 11/1979 | |
| JP | 57107501 | 7/1982 | |
| JP | 62117346 A | 5/1987 | |
| JP | 63153889 | 6/1988 | |
| JP | 64-086527 | 3/1989 | |
| JP | H04-151843 A | 5/1992 | |
| JP | 06268015 A | 9/1994 | |
| JP | 7211722 A | 8/1995 | |
| JP | H08-31835 | 2/1996 | |
| JP | H10-013003 | 1/1998 | |
| JP | H10-125734 A | 5/1998 | |
| JP | H11-087556 | 3/1999 | |
| JP | H11-97576 A | 4/1999 | |
| JP | H11-111886 | 4/1999 | |
| JP | 2000-100869 A | 4/2000 | |
| JP | 2000-183061 | 6/2000 | |
| JP | 2000-277649 A | 10/2000 | |
| JP | 2001-118872 A | 4/2001 | |
| JP | 2001-244365 A | 9/2001 | |
| JP | 2002-016096 A | 1/2002 | |
| JP | 2002-043506 A | 2/2002 | |
| JP | 2002-124548 A | 4/2002 | |
| JP | 2002-261204 A | 9/2002 | |
| JP | 2002-313993 A | 10/2002 | |
| JP | 2002-313996 A | 10/2002 | |
| JP | 2002-353416 A | 12/2002 | |
| JP | 2002-359471 A | 12/2002 | |
| JP | 2003-007768 A | 1/2003 | |
| JP | 2003-037135 A | 2/2003 | |
| JP | 2003-051665 A | 2/2003 | |
| JP | 2003-092472 A | 3/2003 | |
| JP | 2003-124250 A | 4/2003 | |
| JP | 2004-128230 A1 | 4/2004 | |
| JP | 2004-221450 A | 8/2004 | |
| JP | 2004-273957 A | 9/2004 | |
| JP | 2004-342802 A | 12/2004 | |
| JP | 2004-349390 A | 12/2004 | |
| JP | 2005-026645 A | 1/2005 | |
| JP | 2005-032964 A | 2/2005 | |
| JP | 2005-045191 A | 2/2005 | |
| JP | 2005-072270 A | 3/2005 | |

(56) References Cited

FOREIGN PATENT DOCUMENTS

| | | | | |
|---|---|---|---|---|
| JP | 2005-093512 | A | 4/2005 | |
| JP | 2005-123547 | A | 5/2005 | |
| JP | 2005-216696 | A | 8/2005 | |
| JP | 2005-243761 | A | 9/2005 | |
| JP | 2005-285986 | A | 10/2005 | |
| JP | 2006-005322 | A | 1/2006 | |
| JP | 2007-023338 | A | 2/2007 | |
| JP | 2007-129207 | A | 5/2007 | |
| JP | 2007-242900 | A | 9/2007 | |
| JP | 2007-266555 | A | 10/2007 | |
| JP | 2009-177118 | A | 6/2009 | |
| JP | 2010-521587 | A | 6/2010 | |
| JP | 2013-033786 | A | 2/2013 | |
| JP | 2016-21497 | A | 2/2016 | |
| JP | 2018-129475 | | 8/2018 | |
| JP | 2018-160519 | | 10/2018 | |
| KR | 10-2008-0050129 | | 6/2008 | |
| KR | 10-2016-0066272 | | 6/2016 | |
| WO | WO 2001/041207 | A1 | 6/2001 | |
| WO | WO 2005/043584 | A2 | 5/2005 | |
| WO | WO 2005/122706 | A2 | 12/2005 | |
| WO | WO 2007/069606 | A1 | 5/2007 | |
| WO | WO 2008/000020 | A1 | 1/2008 | |
| WO | WO 2008/076428 | A1 | 6/2008 | |
| WO | WO 2009/017758 | A2 | 2/2009 | |
| WO | WO 2009/020572 | A2 | 2/2009 | |
| WO | WO 2009/021266 | A1 | 2/2009 | |
| WO | WO 2016/136064 | A1 | 9/2016 | |
| WO | WO-2022147429 | A1 * | 7/2022 | ........... H01L 23/481 |

OTHER PUBLICATIONS

Che, F.X. et al., "Study on Cu protrusion of through-silicon via," IEEE Transactions on Components, Packaging and Manufacturing Technology, May 2013, vol. 3, No. 5, pp. 732-739.

Dela Pena, Eden M. et al., "Electrodeposited copper using direct and pulse currents from electrolytes containing low concentration of additives," School of Chemical and Process Engineering, University of Strathclyde, 2018 Surface and Coating Technology, 40 pages.

De Messemaeker, Joke et al., "Correlation between Cu microstructure and TSV Cu pumping," 2014 Electronic Components & Technology Conference, pp. 613-619.

Di Cioccio, L. et al., "An overview of patterned metal/dielectric surface bonding: Mechanism, alignment and characterization," Journal of The Electrochemical Society, 2011, vol. 158, No. 6, pp. P81-P86.

Ganesan, Kousik, "Capable copper electrodeposition process for integrated circuit—substrate packaging manufacturing," A dissertation presented in partial fulfillment of the requirments for the degree Doctor of Philosophy, Arizona State University, May 2018, 320 pages. (2 parts).

Gondcharton, P. et al., "Kinetics of low temperature direct copper-copper bonding," Microsyst Technol, 2015, vol. 21, pp. 995-1001.

Heryanto, A. et al., "Effect of copper TSV annealing on via protrustion for TSV wafer fabrication," Journal of Electronic Materials, 2012, vol. 41, No. 9, pp. 2533-2542.

Hobbs, Anthony et al., "Evolution of grain and micro-void structure in electroplated copper interconnects," Materials Transactions, 2002, vol. 43, No. 7, pp. 1629-1632.

Huang, Q., "Effects of impurity elements on isothermal grain growth of electroplated copper," Journal of The Electrochemical Society, 2018, vol. 165, No. 7, pp. D251-D257.

Huang, Q., "Impurities in the electroplated sub-50 nm Cu lines: The effects of the plating additives," Journal of the Electrochemical Society, 2014, vol. 161, No. 9, pp. D388-D394.

Jiang, T. et al., "Plasticity mechanism for copper extrusion in through-silicon vias for three-dimensional interconnects," Applied Physics Letters, 2013, vol. 103, pp. 211906-1-211906-5.

Juang, Jing-Ye et al., "Copper-to-copper direct bonding on highly (111)-oriented nanotwinned copper in no-vacuum ambient," Scientific Reports, Sep. 17, 2018, vol. 8, 11 pages.

Ker, Ming-Dou et al., "Fully process-compatible layout design on bond pad to improve wire bond reliability in CMOS Ics," IEEE Transactions on Components and Packaging Technologies, Jun. 2002, vol. 25, No. 2, pp. 309-316.

Kim, Myung Jun et al., "Characteristics of pulse-reverse electrodeposited Cu thin film," I. Effects of Anodic Step in the Absence of an Organic Additives, Journal of The Electrochemical Society, 2012, vol. 159, No. 9, pp. D538-D543.

Kim, Myung Jun et al., "Characteristics of pulse-reverse electrodeposited Cu thin film," II. Effects of Organic Additives, Journal of The Electrochemical Society, 2012, vol. 159, No. 9, pp. D544-D548.

Liu, C. et al., "Low-temperature direct copper-to-copper bonding enabled by creep on (111) surfaces of nanotwinned Cu," Scientific Reports, May 12, 2015, 5:09734, pp. 1-11.

Liu, Chien-Min et al., "Effect of grain orientations of Cu seed layers on the growth of <111>-oriented nanotwinned Cu," Scientific Reports, 2014, vol. 4, No. 6123, 4 pages.

Liu, Zi-Yu et al. "Detection and formation mechanism of micro-defects in ultrafine pitch Cu—Cu direct bonding," Chin. Phys. B, 2016, vol. 25, No. 1, pp. 018103-1-018103-7.

Lu, L. et al., "Grain growth and strain release in nanocrystalline copper," Journal of Applied Physics, vol. 89, Issue 11, pp. 6408.

Mendez, Julie Marie, "Characterization of copper electroplating and electropolishing processes for semiconductor interconnect metallization," Submitted in partial fulfillment of the requirements for the degree of Doctor of Philosophy, Department of Chemical Engineering, Case Western Reserve University, Aug. 2009, 140 pages.

Menk, L.A. et al., "Galvanostatic plating with a single additive electrolyte for bottom-up filling of copper in Mesoscale TSVs," Microsystems and Engineering Sciences Applications (MESA) Complex, Sandia National Laboratories, Albuquerque, New Mexico, 2019 J. Electrochem. Soc. 166, 17 pages.

Moriceau, H. et al., "Overview of recent direct wafer bonding advances and applications," Advances in Natural Sciences-Nanoscience and Nanotechnology, 2010, 11 pages.

Mott, D. et al., "Synthesis of size-controlled and shaped copper nanoparticles," Langmuir, 2007, vol. 23, No. 10, pp. 5740-5745.

Nakanishi, H. et al., "Studies on SiO2—SiO2 bonding with hydrofluoric acid. Room temperature and low stress bonding technique for MEMS," Sensors and Actuators, 2000, vol. 79, pp. 237-244.

Oberhammer, J. et al., "Sealing of adhesive bonded devices on wafer level," Sensors and Actuators A, 2004, vol. 110, No. 1-3, pp. 407-412, see pp. 407-412, and Figures 1 (a)-1 (I), 6 pages.

Ortleb, Thomas et al., "Controlling macro and micro surface topography for a 45nm copper CMP process using a high resolution profiler," Proc. of SPIE, 2008, vol. 6922, 11 pages.

Parthasaradhy, N.V., "Practical Electroplating Handbook," 1989, Prentice-Hall, Inc., pp. 54-56.

Plobi, A. et al., "Wafer direct bonding: tailoring adhesion between brittle materials," Materials Science and Engineering Review Journal, 1999, R25, 88 pages.

Saraswat, Stanford Presentation, Cu Interconnect slides, web page web.stanford.edu/class/ee311/NOTES/Cu_Interconnect_Slides.pdf, 19 pages.

Song, Xiaohui, "Atomic study of copper-copper bonding using nanoparticles," Journal of Electronic Packaging, Jun. 2020, vol. 142, 5 pages.

Song, Xiaoning, "Microstructure and mechanical properties of electrodeposited copper films," A thesis submitted to the College of Engineering and Physical Sciences of the University of Birmingham, 2011, web page etheses.bham.ac.uk/id/eprint/1764/, 111 pages.

Swingle, Karen D., "Nanograin Copper Deposition Using an Impinging Jet Electrode," A Thesis submitted in partial satisfaction of the requirements of the degree of Master of Science, University of California, San Diego, 2013, 102 pages.

Takahashi, K. et al., "Transport phenomena that control electroplated copper filling of submicron vias and trenches," Journal of The Electrochemical Society, 1999, vol. 146, No. 12, pp. 4499-4503.

Zheng, Z et al., "Study of grain size effect of Cu metallization on interfacial microstructures of solder joints," Microelectronics Reliability, 2019, vol. 99, pp. 44-51.

International Search Report and Written Opinion for PCT/US2021/073169, dated Apr. 22, 2022, 9 pages.

(56) References Cited

OTHER PUBLICATIONS

Suga et al., "Bump-less interconnect for next generation system packaging," Electronic Components and Technology Conference, 2001, IEEE, pp. 1003-1008.
Suga, T., "Feasibility of surface activated bonding for ultra-fine pitch interconnection—A new concept of bump-less direct bonding for system level packaging," The University of Tokyo, Research Center for Science and Technology, 2000 Electronic Components and Technology Conference, 2000 IEEE, pp. 702-705.
Basol et al., "Electrochemical mechanical deposition (ECMDT technique for semiconductor interconnect applications," Microelectronic Engineering, 2002, vol. 64, pp. 43-51.
Basol et al., "Planar copper plating and electropolishing techniques," Chemical Engineering Communication, Jul. 2006, 14 pages.
Basol et al., "Study on the Mechanism of Electrochemical Mechanical Deposition of Copper Layers," Nu Tool Inc., 1655 McCandless Drive, Milpitas, CA 95035, Electrochemical Processes in ULSI and MEMS, Proceedings of the International Symposium; Proceedings vol. 2004-17, pp. 155-160.
Bush, Steve, "Electronica: Automotive power modules from on Semi," ElectronicsWeekly.com, indicating an Onsemi AR0820 product was to be demonstrated at a Nov. 2018 trade show, https://www.electronicsweekly.com/news/products/power-supplies/electronica-automotive-power-modules-semi-2018-11/ (published Nov. 8, 2018; downloaded Jul. 26, 2023).
Khan, Muhammed et al., "Damascene Process and Chemical Mechanical Planarization,"|http://www.ece.umd.edu/class/enee416/GroupActivities/Damascene%20Presentation.pdf, 25 pages.
Morrison, Jim et al., "Samsung Galaxy S7 Edge Teardown," Tech Insights (posted Apr. 24, 2016), includes description of hybrid bonded Sony IMX260 dual-pixel sensor, https://www.techinsights.com/blog/samsung-galaxy-s7-edge-teardown, downloaded Jul. 11, 2023, 9 pages.
Onsemi AR0820 image, cross section of a CMOS image sensor product. The part in the image was shipped on Sep. 16, 2021. Applicant makes no representation that the partin the image is identical to the part identified in the separately submitted reference BUSH, Nov. 8, 2018, ElectronicsWeekly.com ("BUSH article"); however, the imaged part and the part shown in the BUSH article share the part number "ONSEMI AR0820.".
Roy, A. et al., "Annealing effects on the surface properties of Cu—TiC thin films," Materials Today: Proceedings, 2021, vol. 44, Part 1, pp. 170-175.
Sony IMX260 image, a first cross section of Sony product labeled IMX260, showing a hybrid bonded back side illuminated CMOS image sensor with a pad opening for a wire bond. The second image shows a second cross-section with peripheral probe and wire bond pads in the bonded structure. The part in the images was shipped in Apr. 2016. Applicant makes no representation that the part in the images is identical to the part identified in the separately submitted reference Morrison et al. (Tech Insights article dated Apr. 24, 2016), describing and showing a similar sensor product within the Samsung Galaxy S7; however the imaged part and the part shown in the Morrison et al. article share the part name "Sony IMX260 image."
Zik, N. et al., "Thermally produced nano catalyst for biodiesel production: A review," Journal of Advanced Research in Fluid Mechanics and Thermal Sciences, 2018, vol. 52, Issue 2, pp. 139-147.
Definition of Pad, printout from Merriam-Webster, printed on Feb. 25, 2013.
Lau, John H., "Recent advances and trends in Cu—Cu hybrid bonding," IEEE Transactions on Components, Packaging and Manufacturing Technology, Mar. 2023, vol. 13, No. 3, pp. 399-425.
Neo-Manhattan Technology, A Novel HDI Manufacturing Process, "High-density|interconnects for advanced flex substrates & 3-D package stacking," IPC Flex & Chips Symposium, Tempe, AZ, Feb. 11-12, 2003.
North Corporation, "Processed intra-layer interconnection material for PWBs [Etched Copper Bump with Copper Foil]," NMBITM, Version 2001.6.
Paunovic, Milan et al., Modern Electroplating, Fifth Edition, 2010 Wiley & Sons, pp. 1-32.
Yamada, H. et al., "A fine pitch and high aspect ratio bump array for flip-chip interconnection," Proceedings of the International Electronic Manufacturing Technology Symposium, Baltimore, USA, Sep. 28-30, 1992, New York, USA, IEEE, vol. SYMP.13, Sep. 28, 1992, pp. 288-292, XP010259441.
Yamada, H. et al., "A fine pitch and high aspect ratio bump fabrication process for flip-chip interconnection," Proceedings of the Electronic Manufacturing Technology Symposium, Omiya, Japan, Dec. 4-6, 1995, New York, USA, IEEE, Dec. 4, 1995, pp. 121-124, XP010195564.

\* cited by examiner

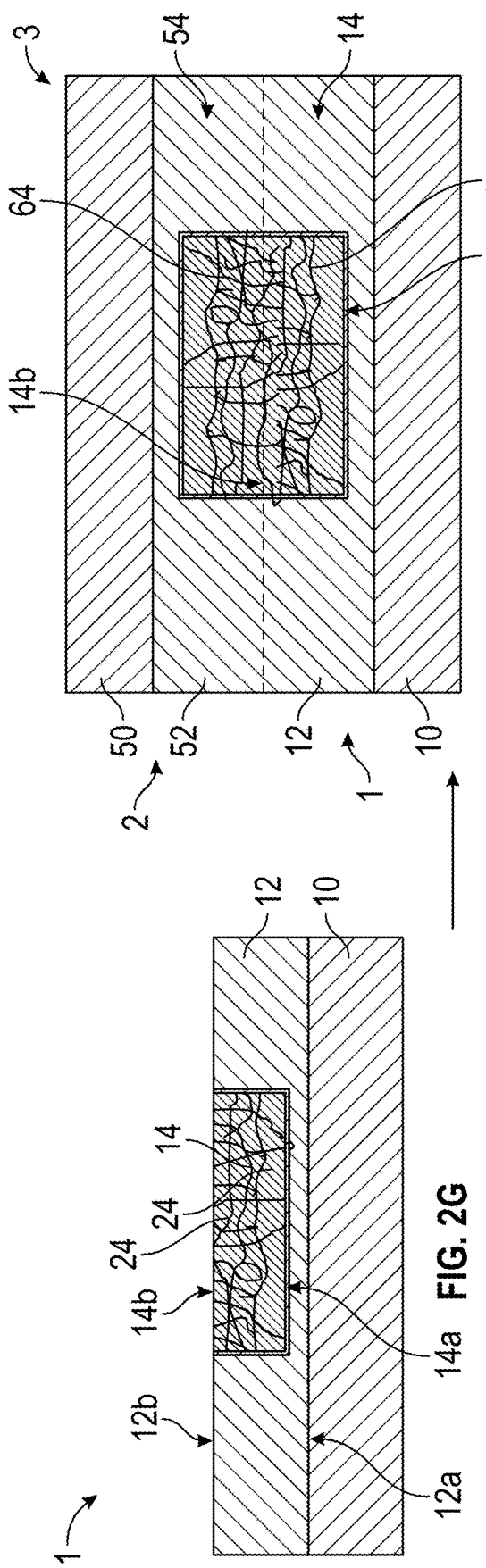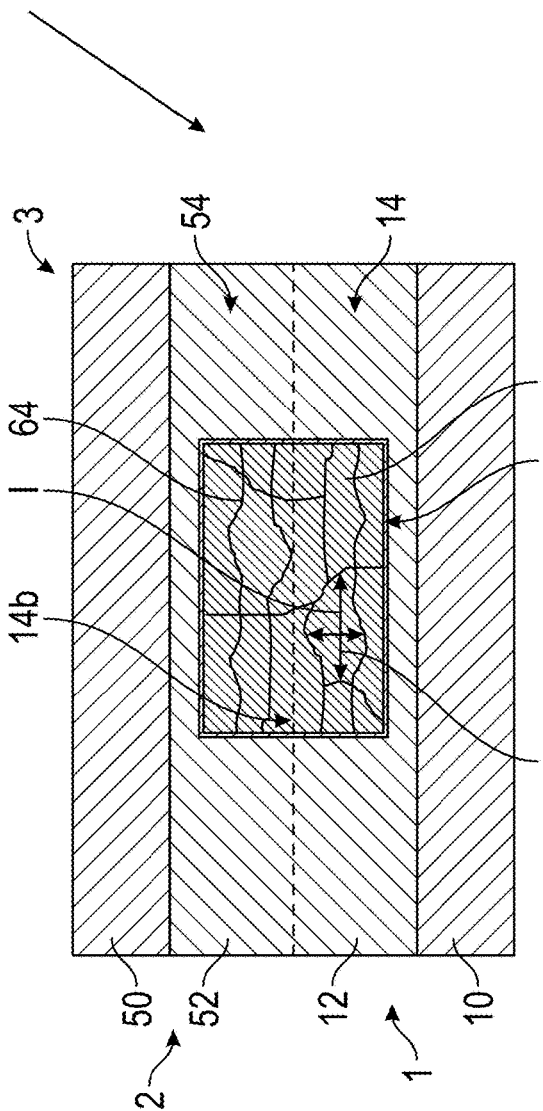

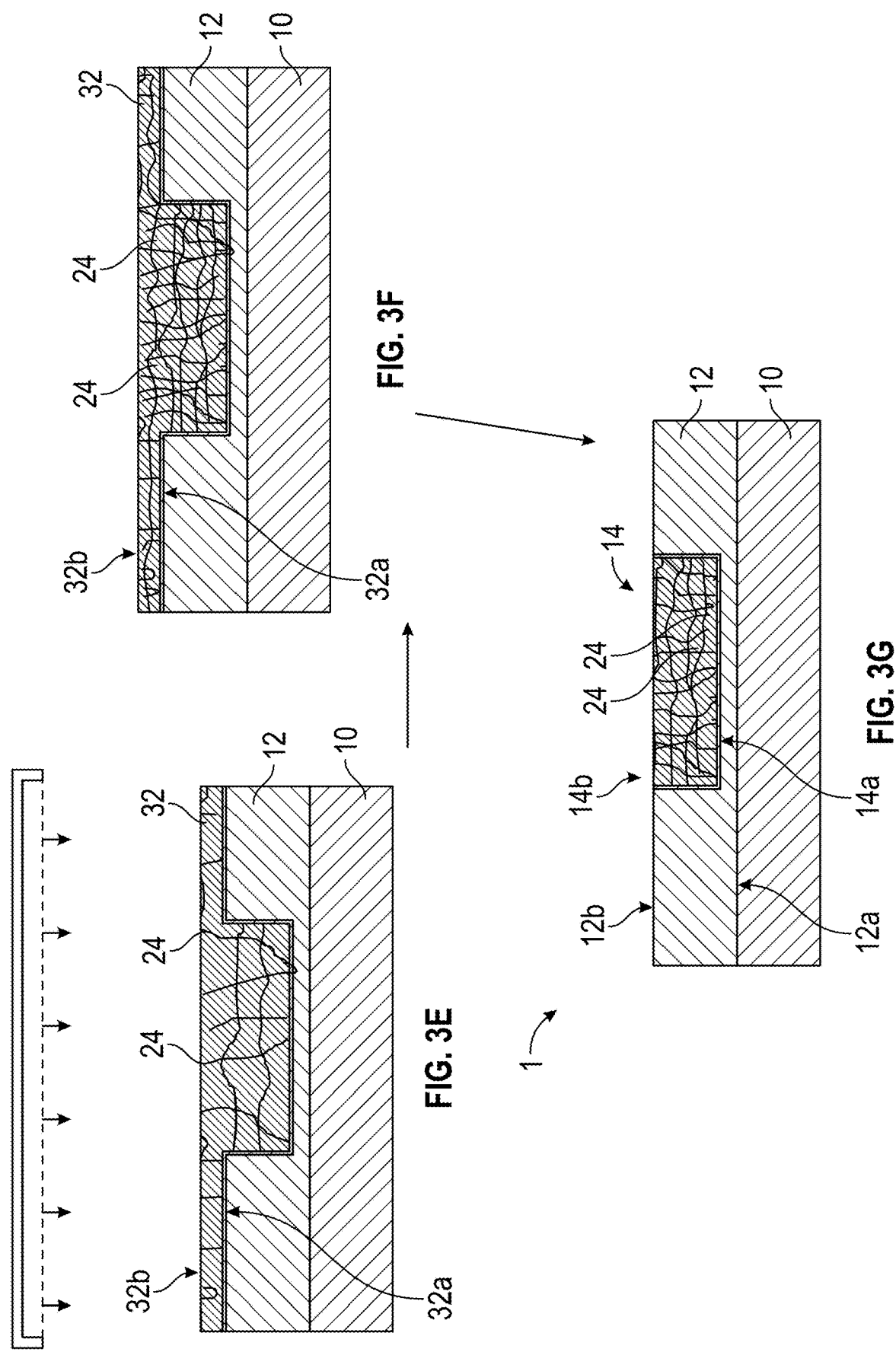

STRUCTURE WITH CONDUCTIVE FEATURE AND METHOD OF FORMING SAME

CROSS-REFERENCE TO RELATED APPLICATIONS

This application claims priority to U.S. Provisional Patent Application No. 63/132,334, filed Dec. 30, 2020, titled "STRUCTURE WITH CONDUCTIVE FEATURE AND METHOD OF FORMING SAME," the entire contents of each of which are hereby incorporated herein by reference.

BACKGROUND

Field of the Invention

The field relates to structures with features, such as surface contact pads, and methods for forming the same, and in particular to structures with conductive features having engineered metal grains, methods for forming the same and for directly bonding such features to conductive features on other elements.

Description of the Related Art

Semiconductor elements, such as integrated device dies or chips, may be mounted or stacked on other elements. For example, a semiconductor element can be mounted to a carrier, such as a package substrate, an interposer, a reconstituted wafer or element, etc. As another example, a semiconductor element can be stacked on top of another semiconductor element, e.g., a first integrated device die can be stacked on a second integrated device die. Each of the semiconductor elements can have conductive pads for mechanically and electrically bonding the semiconductor elements to one another. There is a continuing need for improved methods for forming the conduct pads.

BRIEF DESCRIPTION OF THE DRAWINGS

Specific implementations will now be described with reference to the following drawings, which are provided by way of example, and not limitation.

FIG. 2G shows another step in the manufacturing process for forming the element illustrated in FIG. 1.

FIG. 2H illustrates a schematic cross-sectional view of the element being in contact with another element.

FIG. 2I illustrates a schematic cross-sectional view of a bonded structure.

FIG. 3E shows another step in the manufacturing process for forming the element illustrated in FIG. 1.

FIG. 3F shows another step in the manufacturing process for forming the element illustrated in FIG. 1.

FIG. 3G shows another step in the manufacturing process for forming the element illustrated in FIG. 1.

DETAILED DESCRIPTION

Figure 1:
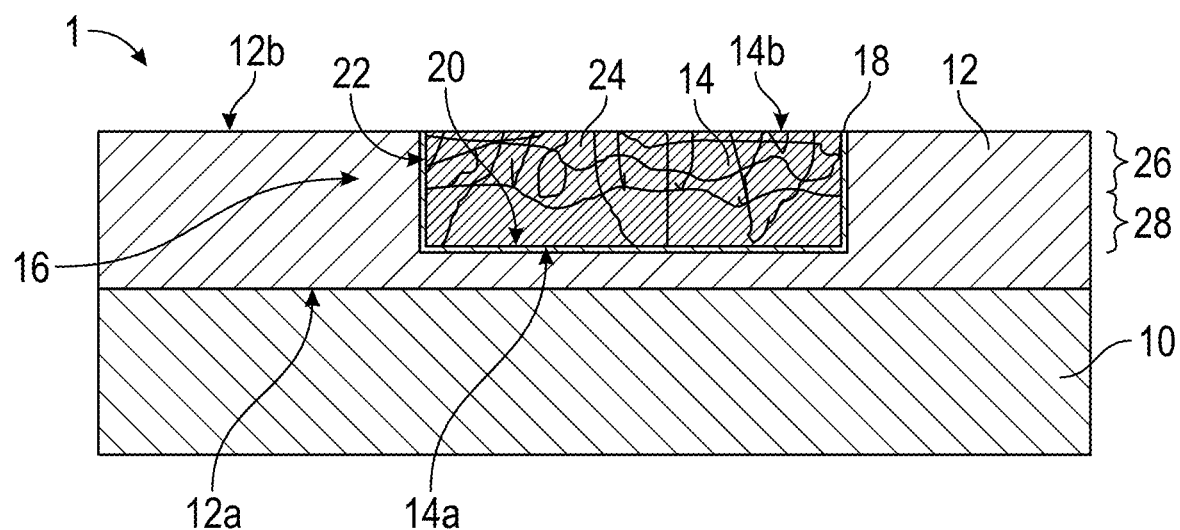
FIG. 1 illustrates a schematic cross-sectional view of an element, according to an embodiment.

The present disclosure describes methods of engineering metallic grain structures for conductive pads in microelectronic elements. Such engineering can be advantageous for direct metal bonding, such as direct hybrid bonding. For example, two or more semiconductor elements (such as integrated device dies, wafers, etc.) may be stacked on or bonded to one another to form a bonded structure. Conductive contact pads of one element may be electrically connected to corresponding conductive contact pads of another element. Any suitable number of elements can be stacked in the bonded structure. The methods and bond pad structures described herein can be useful in other contexts as well.

In some embodiments, the elements are directly bonded to one another without an adhesive. In various embodiments, a non-conductive (e.g., semiconductor or inorganic dielectric) material of a first element can be directly bonded to a corresponding non-conductive (e.g., semiconductor or inorganic dielectric) field region of a second element without an adhesive. In various embodiments, a conductive region (e.g., a metal pad) of the first element can be directly bonded to a corresponding conductive region (e.g., a metal pad) of the second element without an adhesive. The non-conductive material can be referred to as a nonconductive bonding region or bonding layer of the first element. In some embodiments, the non-conductive material of the first element can be directly bonded to the corresponding non-conductive material of the second element using bonding techniques without an adhesive using the direct bonding techniques disclosed at least in U.S. Pat. Nos. 9,564,414; 9,391,143; and 10,434,749, the entire contents of each of which are incorporated by reference herein in their entirety and for all purposes. In other applications, in a bonded structure, a non-conductive material of a first element can be directly bonded to a conductive material of a second element, such that a conductive material of the first element is intimately mated with a non-conductive material of the second element. Suitable dielectric materials for direct bonding include but are not limited to inorganic dielectrics, such as silicon oxide, silicon nitride, or silicon oxynitride, or can include carbon, such as silicon carbide, silicon oxycarbonitride, silicon carbonitride or diamond-like carbon. Such carbon-containing ceramic materials can be considered inorganic, despite the inclusion of carbon. Additional examples of hybrid direct bonding may be found throughout U.S. Pat. No. 11,056,390, the entire contents of which are incorporated by reference herein in their entirety and for all purposes.

In various embodiments, direct bonds can be formed without an intervening adhesive. For example, semiconductor or dielectric bonding surfaces can be polished to a high degree of smoothness. The bonding surfaces can be cleaned and exposed to a plasma to activate the surfaces. In some embodiments, the surfaces can be terminated with a species after activation or during activation (e.g., during the plasma processes). Without being limited by theory, in some embodiments, the activation process can be performed to break chemical bonds at the bonding surface, and the termination process can provide additional chemical species at the bonding surface that improves the bonding energy during direct bonding. In some embodiments, the activation and termination are provided in the same step, e.g., a plasma or wet etchant to activate and terminate the surfaces. In other embodiments, the bonding surface can be terminated in a separate treatment to provide the additional species for direct bonding. In various embodiments, the terminating species can comprise nitrogen. Further, in some embodiments, the bonding surfaces can be exposed to fluorine. For example, there may be one or multiple fluorine peaks near layer and/or bonding interfaces. Thus, in the directly bonded structures, the bonding interface between two non-conductive materials can comprise a very smooth interface with higher nitrogen content and/or fluorine peaks at the bonding interface. Additional examples of activation and/or termination treatments may be found throughout U.S. Pat. Nos. 9,564,414; 9,391,143; and 10,434,749, the entire contents of each of which are incorporated by reference herein in their entirety and for all purposes.

In various embodiments, conductive contact pads of the first element can also be directly bonded to corresponding conductive contact pads of the second element. For example, a direct hybrid bonding technique can be used to provide conductor-to-conductor direct bonds along a bond interface that includes covalently direct bonded dielectric-to-dielectric surfaces, prepared as described above. In various embodiments, the conductor-to-conductor (e.g., contact pad to contact pad) direct bonds and the dielectric-to-dielectric hybrid bonds can be formed using the direct bonding techniques disclosed at least in U.S. Pat. Nos. 9,716,033 and 9,852,988, the entire contents of each of which are incorporated by reference herein in their entirety and for all purposes. The bond structures described herein can also be useful for direct metal bonding without non-conductive region bonding, or for other bonding techniques.

In some embodiments, inorganic dielectric bonding surfaces can be prepared and directly bonded to one another without an intervening adhesive as explained above. Conductive contact pads (which may be surrounded by nonconductive dielectric field regions) may also directly bond to one another without an intervening adhesive. In some embodiments, the respective contact pads can be recessed below exterior (e.g., upper) surfaces of the dielectric field or nonconductive bonding regions, for example, recessed by less than 30 nm, less than 20 nm, less than 15 nm, or less than 10 nm, for example, recessed in a range of 2 nm to 20 nm, or in a range of 4 nm to 10 nm. The nonconductive bonding regions can be directly bonded to one another without an adhesive at room temperature in some embodiments and, subsequently, the bonded structure can be annealed. Upon annealing, the contact pads can expand with respect to the nonconductive bonding regions and contact one another to form a metal-to-metal direct bond. Beneficially, the use of hybrid bonding techniques, such as Direct Bond Interconnect, or DBI®, available commercially from Xperi of San Jose, CA, can enable high density of pads connected across the direct bond interface (e.g., small or fine pitches for regular arrays). In various embodiments, the contact pads can comprise copper or copper alloys, although other metals may be suitable.

Thus, in direct bonding processes, a first element can be directly bonded to a second element without an intervening adhesive. In some arrangements, the first element can comprise a singulated element, such as a singulated integrated device die. In other arrangements, the first element can comprise a carrier or substrate (e.g., a wafer) that includes a plurality (e.g., tens, hundreds, or more) of device regions that, when singulated, form a plurality of integrated device dies. Similarly, the second element can comprise a singulated element, such as a singulated integrated device die. In other arrangements, the second element can comprise a carrier or substrate (e.g., a wafer).

As explained herein, the first and second elements can be directly bonded to one another without an adhesive, which is different from a deposition process. The first and second elements can accordingly comprise non-deposited elements. Further, directly bonded structures, unlike deposited layers, can include a defect region along the bond interface in which nanovoids are present. The nanovoids may be formed due to activation of the bonding surfaces (e.g., exposure to a plasma). As explained above, the bond interface can include concentration of materials from the activation. For example, in embodiments that utilize a nitrogen plasma for activation, a nitrogen peak can be formed at the bond interface. In embodiments that utilize an oxygen plasma for activation, an oxygen peak can be formed at the bond interface. In some embodiments, the bond interface can comprise a nitrogen-terminated inorganic non-conductive material, such as nitrogen-terminated silicon, silicon oxide, silicon nitride, silicon oxynitride, silicon carbide, silicon oxycarbide, silicon oxycarbonitride, etc. Thus, the surface of the bonding layer can comprise silicon nitride, silicon oxynitride, silicon oxycarbonitride, or silicon carbonitride, with levels of nitrogen present at the bonding interface that are indicative of nitrogen termination of at least one of the elements prior to direct bonding. In some embodiments, nitrogen and nitrogen related moieties may not be present at the bonding interface. As explained herein, the direct bond can comprise a covalent bond, which is stronger than van Der Waals bonds. The bonding layers can also comprise polished surfaces that are planarized to a high degree of smoothness.

In various embodiments, the metal-to-metal bonds between the contact pads can be joined such that copper grains grow into each other across the bond interface. In some embodiments, the copper can have grains oriented vertically along the 111 crystal plane for improved copper diffusion across the bond interface. In some embodiments, the misorientation of 111 crystal plane in the conductive material may be in a range of ±30° with respect to the vertical direction from the surface of the conductive material. In some embodiments, the crystal misorientation can be in a range of ±20°, or in a range of ±15°, with respect to the vertical direction. The bond interface can extend substantially entirely to at least a portion of the bonded contact pads, such that there is substantially no gap between the nonconductive bonding regions at or near the bonded contact pads. In some embodiments, a barrier layer may be provided under the contact pads (e.g., which may include copper). In other embodiments, however, there may be no barrier layer under the contact pads, for example, as described in US 2019/0096741, which is incorporated by reference herein in its entirety and for all purposes.

Annealing temperatures and annealing durations for forming the metal-to-metal direct bond can affect the consumption of thermal budget by the annealing. It may be desirable to lower the annealing temperature and/or annealing duration to minimize consumption of the thermal (energy) budget. Surface diffusion of atoms along the 111 crystal plane (<111>) can be 3 to 4 orders of magnitude faster than along the 100 or 110 crystal planes. Also, a metal (e.g., Cu) with grains oriented along a 111 crystal plane can have a higher surface mobility as compared to conventional back end of line (BEOL) copper. Further, low-temperature direct metal-to-metal bonding is enabled by creep on the 111 planes of Cu. Therefore, it can be advantageous to have the 111 crystal plane on the bonding surface in order to shorten the annealing time and/or reduce the annealing temperature for direct bonding (e.g., direct hybrid bonding). The advantage to have the 111 crystal plane can be pronounced especially at lower temperatures because the metal surface diffusion (e.g., Cu surface diffusion) also slows down when the annealing temperature is reduced. Accordingly, in various embodiments disclosed herein, a crystal structure can have grains oriented vertically along the 111 crystal plane to enhance metal diffusion (e.g., copper diffusion) during direct bonding.

A metal layer can be formed with a process selected to plate a copper (Cu) layer having Cu in the 111 crystal orientation at or near the bonding surface of the conductive layer or bonding pad. The Cu layer may be deposited from a non-superfilling or super-filling electroplating bath, for example, with plating chemistry selected to optimize efficient filling of voids or embedded cavities (e.g., vias, trenches) in the substrate, rather than to optimize the direct metal-to-metal bonding to occur during direct hybrid bonding. Subsequent metal treatment, described hereinbelow, can facilitate subsequent bonding such that any desirable plating chemistry can be employed to optimize for other considerations, such as filling noted above. The microstructure (e.g., a grain size) of the deposited or coated metal layer is typically less than 50 nm and may need to be stabilized, for example by an annealing step (at temperature typically lower than 300° C.). After the plated metal stabilization step, the coated metal can be planarized by CMP methods to remove unwanted materials (excess plated metal, barrier layer, and/or portion of the non-conductive layer) to form the planar bond surface. The bonding surface can include a planar non-conductive portion that surrounds an adequately dispersed planar conductive portion.

Various embodiments disclosed herein relate to forming an element with a conductive pad that has a direct bonding surface having a 111 crystal plane orientation independent of plating chemistry. The direct bonding surface can have a cold worked surface with nano-grains that is independent of a metal coating method such as electroplating, electroless, physical vapor deposition (PVD) amongst others. Therefore, various embodiments disclosed herein provide greater flexibility for the design of plating processes and/or more efficient conductive material filling, as compared to conventional plating processes tuned for forming a 111 crystal plane orientation. In some embodiments, the conductive pad (e.g., plated Cu in a damascene cavity) can be treated by a cold work process at room temperature and/or below room temperature. In some embodiments, the surface of the coated conductive material including the conductive pad can be treated by way of peening in which the conductive pad is bombarded with a stream of particles, such as metal, glass, or ceramic. In some embodiments, the cold work process may comprise, for example, cold rolling a coated conductive material to reduce the grain size of the coated conductive material. A lubricating fluid with and/or without colloidal particles may be used in the cold rolling process. In some embodiments, grain boundaries of the deformed grains of conductive pad can comprise subgrains, high angle grain boundaries, twins massive dislocations and/or dislocation networks. In some embodiments, nano-spaced nano-twinned grains and/or nano-laminates can be formed within the conductive pad.

In some embodiments, a texture gradient and a grain-size gradient within the conductive pad can be formed by the cold work process. For example, smaller grains and/or a lower percentage of 111 oriented crystals can be achieved near the surface of the pad as compared to deeper within the pad. The cold worked coated conductive material or layers deform plastically. Most of the mechanical energy expended in the deformation process can be converted into heat and the remainder can be stored in the deformed structure with the creation of lattice imperfections. The lattice imperfections can include fine grains, high angle grain boundaries, mechanical twins and/or nano-twins, dislocations, vacancies etc. In the deformed conductive layer (pads and traces), the dominant contribution to the stored energy of the cold work process can be the energy associated with the formation of the additional lattice imperfections present relative to those in an undeformed portion of the annealed conductive layer. The deformation process can induce residual compressive stress in the conductive pad. This residual compressive stress may vary from the surface of the pad to the bottom of the pad. Depending on the energy imparted to the metal in the cold working process, upper portions of the pad may have a higher residual stress compared to the lower portions of the pad.

Various embodiments disclosed herein allows for relatively low temperature annealing for metal-to-metal direct bonding while being independent of electroplating baths, electroplating methods and/or other conductive layer coating or forming method. In some embodiments, stored energy in a portion of the cold-worked conductive layer can contribute to enabling a relatively low temperature annealing. In some embodiments, the annealing temperature for bonding can be, for example, between about 50° C. and about 250° C., between about 100° C. and about 200° C., 125° C. and about 170° C. or between about 50° C. and about 180° C. Depending on the annealing temperature or temperatures, the annealing time may range between 45 minutes to 180 minutes. The annealing time may increase when the annealing temperature is lower. However, the embodiments disclosed herein can still lower consumption of the thermal (energy) budget relative to conventional structures, such that anneal durations can remain low despite lower anneal temperatures.

FIG. 1 illustrates a schematic cross-sectional view of an element 1, according to an embodiment. The element 1 can comprise a semiconductor element, either before singulation, such as a semiconductor substrate or wafer, or after singulation, such as an interposer, electronic component, integrated circuit (IC) die or chip. The element 1 can include a substrate 10 (e.g., bulk semiconductor material), a non-conductive layer (e.g., a dielectric layer 12, such as silicon oxide or other low k material) over the substrate 10, a conductive pad 14 disposed in a cavity 16 formed in the dielectric layer 12, and a barrier layer 18 disposed between the dielectric layer 12 and the conductive pad 14. While for simplicity a single dielectric layer 12 is illustrated, the skilled artisan will understand that the dielectric layer 12 and conductive pad 14 can comprise part of a back-end-of-line (BEOL) structure or redistribution layer (RDL) structure over a BEOL structure, which typically includes vias and trenches or traces (not shown). In some embodiment, the conductive pad or via or trace may comprise an alloy of copper, nickel, gold, or other metal alloys.

In some embodiments, the substrate 10 can comprise a semiconductor substrate or wafer. In some embodiments, the substrate 10 can comprise a glass substrate, a dielectric substrate, or a ceramic substrate.

The dielectric layer 12 can comprise a relatively low k (e.g., k<4) dielectric material. In some embodiments, the dielectric layer 12 can comprise an inorganic material. The dielectric layer 12 can have a lower side 12a that faces the substrate 10 and an upper side 12b opposite the lower side 12a. The upper side 12b can define a bonding surface of the dielectric layer 12, and can thus include, for example, a higher concentration of nitrogen and/or fluorine compared to the bulk material of the layer, as described above. In some embodiments, the bonding surface at the upper side can be defined by a barrier or etch stop layer (not shown) over the low k dielectric layer 12. The dielectric layer 12 can have the cavity 16 that at least partially extends through a thickness of the dielectric layer 12 from the upper side 12b. The cavity 16 has a bottom side 20 and sidewalls 22.

The conductive pad 14 can have a lower side 14a that faces the bottom side 20 of the cavity and an upper side 14b opposite the lower side 14a. The upper side 14b can define a bonding surface of the conductive pad 14. The conductive pad 14 can comprise a metal such as copper (Cu). The conductive pad 14 can comprise copper with grains oriented along a 111 crystal plane. In some embodiments, the conductive pad 14 can comprise a cold worked or mechanically or optically deformed pad.

Sizes of the grains 24 in the element 1 can vary in deformed conductive pads 14. A size of the grain 24 used herein may refer the maximum dimension of the grain 24. In some embodiments, the grains 24 at or near the upper side 14b can be smaller on average than the grains 24 at or near the lower side 14a. In some embodiments, the grains can have a small grain region 26 at or near the upper side 14b of the conductive pad 14 and a large grain region 28 at or near the lower side 14a of the conductive pad 14. In some embodiments, the small grain region 26 can be arbitrarily selected to be a region of the conductive pad 14 from the upper side 14b to 1000 nm deep into the conductive pad 14 for a shallow conductive pad 14, or to 3000 nm in a deeper conductive pad 14 (e.g., pads of thickness greater than 5000 nm), for purposes of comparing grain sizes above and below this level. In some embodiments, an average grain size in the small grain region 26 at or near the upper side 14b can be about 10 nanometers (nm) to 200 nm, or about 30 nm to 200 nm. In some embodiments, an average grain size in the large grain region 28 at or near the lower side 14a can be about 0.5 microns (μm) to 5 μm. In some embodiments the average grain size can vary depending on the width and depth of the conductive pad 14. In some embodiments, the average size of the grain 24 at or near the lower side 14a can be at least five times greater than the average size of the grains 24 at or near the upper side 14b. For example, the average size of the grain 24 at or near the lower side 14a can be about 3 to 100, 10 to 100, 20 to 100, 30 to 100, 40 to 100, or 40 to 100, times greater than the average size of the grains 24 at or near the upper side 14b of the deformed conductive pad 14. In some embodiments, the grains 24 can have graded grain sizes through the depth of the conductive pad 14 as a result of the gradation of lattice imperfections from the upper side 14b to the lower side 14a. In some embodiments, the conductive pad 14 can be measurably harder at or near the upper side 14b than at or near the lower side 14a. In some embodiments, the average size of 3 contiguous grains 24 at or near the lower side 14a can be about 3 to 100, 10 to 100, 20 to 100, 30 to 100, 40 to 100, or 40 to 100, times greater than the average size of 3 contiguous grains 24 at or near the upper side 14b of the deformed conductive pad 14. Similarly, the average grain size of 2 contiguous grains 24 at or near the upper side 14b of the deformed conductive pad 14 can be at least 2 times smaller than the average of 2 contiguous grain in an interconnect layer below the barrier layer 18 (not shown) of the deformed conductive pad 14. In some embodiments, at a higher determined deformation of the coated conductive layer, the grain size of 3 contiguous grains 24 near the upper side 14b of the conductive pad 14 and lower side 14a of the conductive pad 14 are similar, and can be at least 3 times smaller than grain size at corresponding locations in undeformed conductive pads 14.

Upon thermal annealing after cold working, such as during bonding the conductive pad 14 to another conductive pad of another element, to release the stored energy in the deformed conductive pad 14 (deformed due to compressive stress induced by mechanical or optical peening) and to enhance grain recovery and growth, the recovered grains of the upper side 14b region of the conductive pad 14 can be larger than the recovered grains of the lower side 14a region beneath (see FIG. 2I). The grain sizes at the upper side 14b can exceed the sizes at the lower side 14a to produce a reversed gradient from that just after the cold working process. Similarly the grain sizes at the upper side 14b can exceed the sizes of an interconnect layer below the barrier layer 18 (not shown) of the deformed conductive pad 14.

In some embodiments, the upper side 14b of the conductive pad 14 can be recessed below the upper side 12b of the dielectric layer 12. For example, the upper side 14b of the conductive pad 14 can be recessed below the upper side 12b of the dielectric layer 12 by less than about 30 nm, less than about 20 nm, less than about 15 nm, or less than about 10 nm. For example, the upper side 14b of the conductive pad 14 can be recessed below the upper side 12b of the dielectric layer 12 in a range of 2 nm to 20 nm, or in a range of 4 nm to 15 nm.

The barrier layer 18 can comprise, for example, a dielectric barrier layer, such as silicon nitride, silicon oxynitride, silicon carbonitride, diamond-like carbon, etc. The barrier layer 18 can comprise a conductive barrier, such as a metal nitride (e.g., Ta, TiN, TaN, WN, and their various combinations etc.). For example, a conductive barrier layer 18 can be deposited over the bottom side 20 and the sidewalls 22 of the cavity 16. A non-conductive barrier layer 18 may be formed on the sidewalls 22, and not at the bottom side 20 of the cavity 16. In some embodiments, the non-conductive barrier layer 18 may be discontinuous over the bottom side 20 of the cavity 16. The barrier layer 18 can intervene between the dielectric layer 12 and the conductive pad 14.

FIGS. 2A-2G show stages in a manufacturing process for forming the element 1 illustrated in FIG. 1, according to an embodiment. FIG. 2H shows the element 1 being in contact with another element (a second element 2), and FIG. 2I shows a bonded structure 3 that include the element 1 and the second element 2.

Figure 2C:
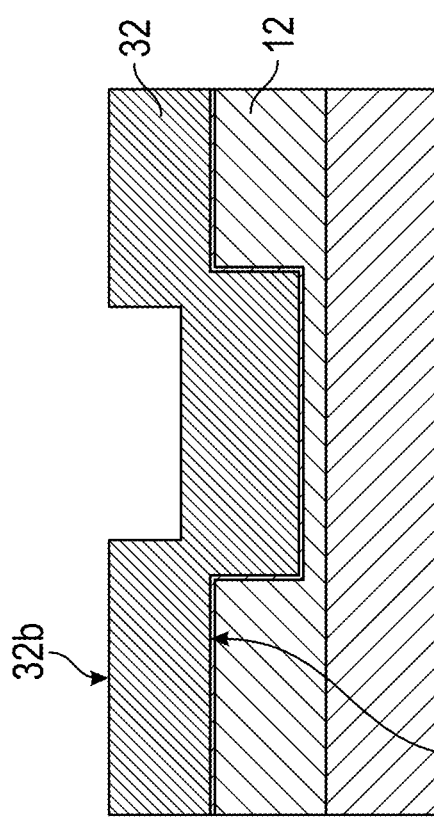
FIG. 2C shows another step in the manufacturing process for forming the element illustrated in FIG. 1.
Figure 2D:
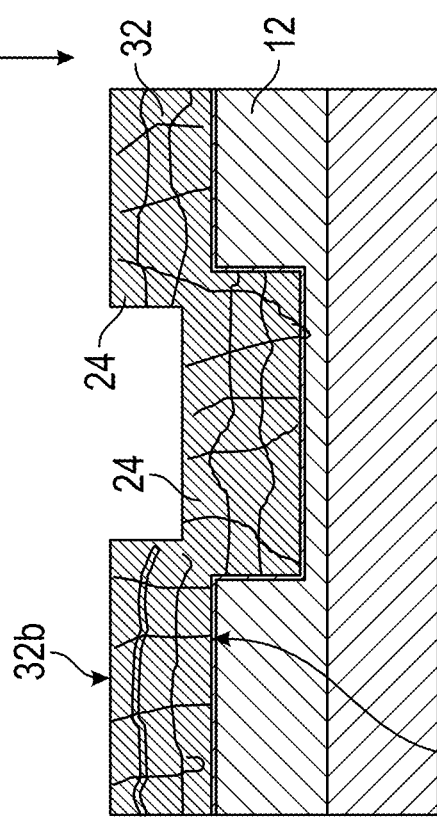
FIG. 2D shows another step in the manufacturing process for forming the element illustrated in FIG. 1.
Figure 2A:
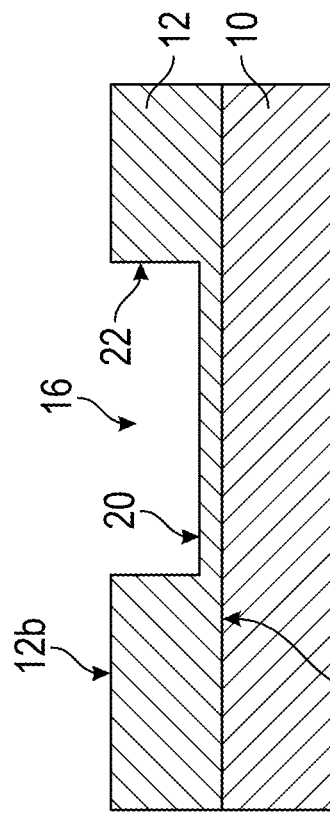
FIG. 2A shows a step in a manufacturing process for forming the element illustrated in FIG. 1, according to an embodiment.

In FIG. 2A, a dielectric layer 12 is provided over a substrate 10. A cavity 16 is selectively formed in the dielectric layer 12, including an upper surface 12b. The cavity 16, shown with a bottom surface 20 and sidewall surfaces 22, can extend through at least a portion of a thickness of the dielectric layer 12. The cavity 16 can be formed by way of masking and etching or drilling. The cavity 16 can comprise a damascene cavity that is formed with damascene processes. The cavity 16 may comprise a thru substrate cavity (TSC) such as a through silicon via (TSV) or a through glass via (TGV). In some embodiments, the cavity 16 may be formed to be in contact with an embedded interconnect structure such as a BEOL or RDL layer (not shown).

Figure 2B:
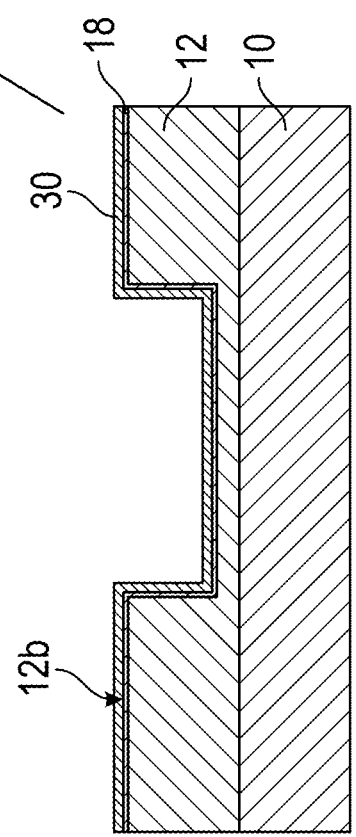
FIG. 2B shows another step in the manufacturing process for forming the element illustrated in FIG. 1.

In FIG. 2B, a barrier layer 18 can be provided on the upper surface 12b of the dielectric layer, the sidewalls 22 of the cavity 16, and the bottom surface 20 of the cavity 16. As mentioned earlier the barrier layer 18 may be a non-conductive material formed on the upper surface 12b of the dielectric layer, the sidewalls 22 of the cavity 16, and not at the bottom surface 20 of the cavity 16. A seed layer 30 can be provided on the barrier layer 18 over these same surfaces. In some embodiments, a conductive via or vias or one or more traces (not shown) contacting the barrier layer 18 may be disposed beneath the lower surface 20 of the cavity 16.

In FIG. 2C, a conductive material 32 can be provided in the cavity 16 and over the upper side 12b of the dielectric layer 12. In some embodiments, the conductive material can comprise metal, such as copper (Cu), and can be provided, for example, by plating or other known methods. In some embodiment, the conductive material 32 may comprise an alloy of copper, nickel, gold, or other metal alloys. The conductive material 32 can have a lower side 32a and an upper side 32b. Advantageously, the plating methods and additives can be optimized for efficiently filling the cavity 16, which may be just one of many vias and/or trenches across the substrate, and which can have high aspect ratios. In some embodiments, the conductive material 32 can comprise an electroplating coating formed at or below room temperature. The room temperature can be defined as temperatures in a range of, for example, 20° C. to 35° C. The plated metal of the conductive material 32 can have grain sizes in a range of between 10 nm to 100 nm, or 30 nm to 100 nm in the as-plated state.

In FIG. 2D, the conductive material 32 can be annealed at a temperature between room temperature and 250° C. In some embodiment, some electroplated copper films with low interstitial and non-interstitial impurities can form large grains at room temperatures due to room temperature grain growth phenomenon. The annealing process can stabilize the microstructure (e.g., a grain size) of grains 24 in the conductive material 32. The annealing process can form relatively large grains 24 in the conductive material 32. For relatively large pads greater than 5 microns across, the grain size of the conductive material after annealing can be in a range of, for example, 0.3 microns to 3 microns. For conductive traces with width less than 1 microns, the grain structure may exhibit a bamboo type grain structure extending along the trace axes.

Figure 2E:
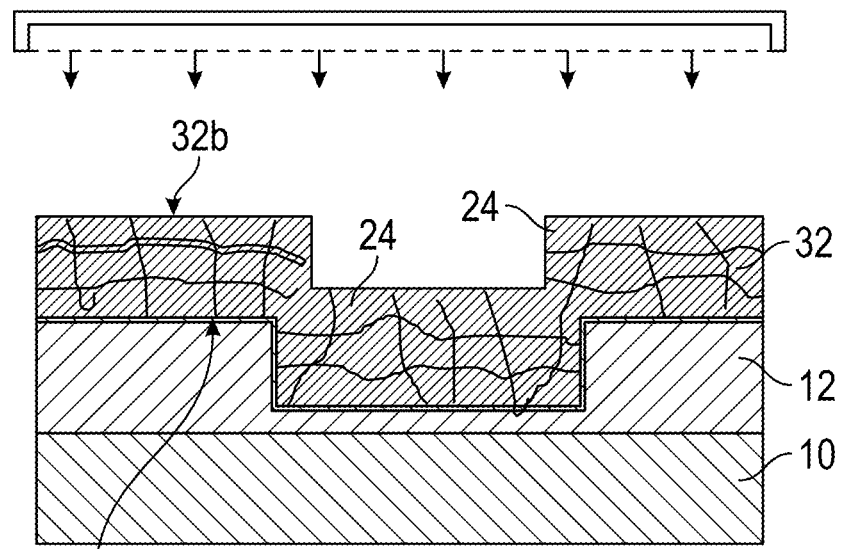
FIG. 2E shows another step in the manufacturing process for forming the element illustrated in FIG. 1.

In FIG. 2E, the conductive material 32 can be treated with a cold work process. The cold work process can take place at room temperature and/or below room temperature. For example, the substrate temperature during the cold work process may range from −196° C. (77K), the temperature of liquid nitrogen, to about 30° C. or 50° C., or from 0° C. to about 25° C., and in one example at about ambient clean room temperature. The conductive material 32 can be treated from the upper side 32b. In some embodiments, the conductive material 21 can be treated with a strain hardening process. For example, the conductive material 32 can be treated by a shot peening process, cold rolling or laser peening process to induce plastic deformation in the conductive material 32. As noted above, shot peening can include bombardment by particles, such as metal, sand, glass, or ceramic. For example, the mechanical peening may include bombarding the surface (e.g., the upper side 32b) of the conductive material 32 with ceramic or steel shots. For example, s diameter of the shots may range between 0.1 mm and 2 mm, a velocity of the shots can be between 1 to 5 meters per second, and a bombardment time can be between 30 s to 180 s. In some embodiments, the substrate 10 may rotate between 10 to 60 rpm and preferably between 15 to 45 rpm during the peening operation. In some embodiments, the element 1 can be static during the peening operation. The plastic deformation can induce residual compressive stresses in the grains 24 at the surface and below the surface of the conductive material 32 and/or tensile stresses at an interior or bulk of the conductive material 32. The conductive material 32 after the cold work process can have stored energy from compressive residual stress. In some embodiments, a portion of the conductive material 32 at or near the upper side 32b can have higher stored energy from the cold work process than the lower side 32a. In some embodiment, the conductive material 32 can be uniformly deformed from the top surface 32b to the bottom surface 32a, including a portion of the conductive material 32 at the bottom of the cavity 20 adjacent to the barrier layer 18. The conductive material 32 may be heavily deformed such that it is challenging to distinguish the individual metal grains because of the massive structural defects such as stacking faults, mechanical twins, slips, vacancies, and/or dislocation networks induced by the deformation process. As a result of the structural defects and very small grain sizes (e.g., 5 nm to 30 nm), it may be challenging to index the individual grains 24 for their orientation. Regardless of the method of applying compressive force or forces to the conductive material 32, the applied force should degrade the substrate 1. Degrading the element 1 may, for example, comprise applying excessive force so as to induce delamination of the barrier layer 18 or induce defects or cracks in the dielectric layer 12 and/or the substrate 10. The stored energy can contribute to achieving a relatively low temperature annealing bonding (see FIG. 2I).

Figure 2F:
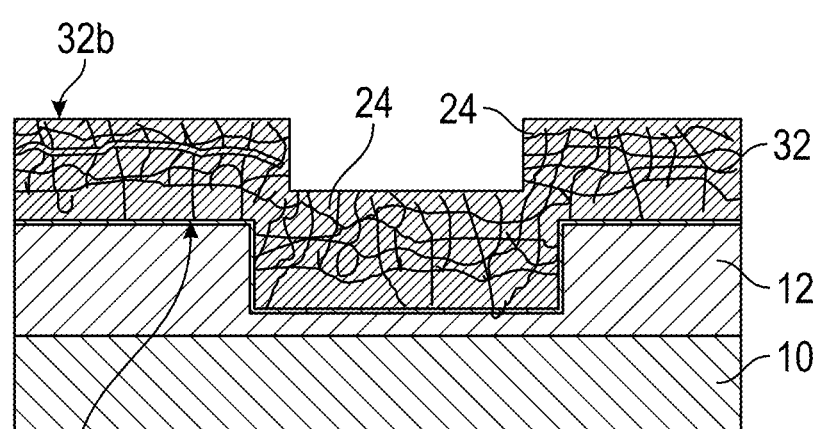
FIG. 2F shows another step in the manufacturing process for forming the element illustrated in FIG. 1.

FIG. 2F shows the grains 24 after the treatment in FIG. 2E. Sizes of the grains 24 in the conductive material 32 can vary. In some embodiments, the grains 24 at or near the upper side 32b can be smaller than the grains 24 at or near the lower side 32a. In some embodiments, an average size of the grains 24 at or near the upper side 32b can be about 10 nanometers (nm) to 200 nm, or about 50 nm to 200 nm. In some embodiments, an average size of the grains 24 at or near the lower side 32a or at the interior of the cavity can be about 0.5 microns (μm) to 1 μm. In some embodiments, the average size of the grains 24 at or near the lower side 32a can be at least about five times greater than the average size of the grains 24 at or near the upper side 32b. For example, the average size of the grain 24 at or near the lower side 32a can be about 10 to 100, 20 to 100, 30 to 100, 40 to 100, or 40 to 100, times greater than the average size of the grains 24 at or near the upper side 32b. In some embodiments, because of the top to bottom variation in the compressive residual stress in the conductive material, the grains 24 can have gradient grain sizes. For example, the grain sizes of the grains 24 can gradually increase from the upper side 32b to the lower side 32a or in the interior of the conductive cavity or layer. In some embodiments, the conductive material 32 can be harder at or near the upper side 32b than at or near the lower side 32a. As compared to the deeper or bulk material near the lower side 32a, the conductive material 32 near the upper side 32b can have a lower percentage of grains 24 with vertically oriented 111 crystal planes and comparatively higher percentage of 220 crystal planes (<220>) from the deformation process. In some embodiments, especially when laser peening method is applied to the conductive material 32, the cold working of the conductive layer can be sufficiently deep, such that the smaller grains at the upper surface 32b are similar to those at lower side 32a or at the interior of the cavity.

In some applications, the conductive material 32 may comprise a portion of a through substrate pad (not shown), such as a through-silicon via (TSV) or through-glass via (TGV). Here, a portion of the conductive material 32 at or near the upper surface 32b may exhibit lattice imperfections from the cold working step.

In FIG. 2G, the element 1 is formed and prepared for direct bonding, such as by a high degree of polishing and activation (e.g., nitrogen termination). At least a portion of the conductive material 32 can be removed, such as by polishing. Portions of the barrier layer 18 and the seed layer 30 can also be removed. Although the slurry chemistry for chemical mechanical planarization (CM) can be selective to stop on the dielectric layer 12, a portion of the dielectric layer 12 can also be removed to form a bonding surface. The bonding surface can include highly polished surfaces of the non-conductive layer 12b and the upper surface 14b of the planar conductive material. In some embodiments, the portions of the conductive material, barrier layer 18, seed layer 30, and the dielectric layer 12 can be removed by polishing, such as chemical mechanical polishing (CMP), in one or multiple stages with one or multiple different slurry compositions to form the bonding surface. The upper side 12b of the dielectric layer 12 can be polished to a high degree of smoothness to prepare for direct bonding, followed by very slight etching and/or surface activation, such as by exposure to nitrogen-containing plasma. The activated bonding surface is cleaned with a suitable solvent such as deionized water (DI) water to remove unwanted particles. The cleaned surface may be spun dried to remove cleaning solvent residues prior to a bonding operation and subsequent annealing step.

In some embodiments, the highly polished bonding surfaces of the non-conductive layer 12b and the upper surface 14b of the planar conductive material of the substrate 10 may be coated with a protective layer (not shown), typically with an organic resist layer. The coated substrate can be mounted on a dicing frame for singulation. The singulation process may be formed by any known process, for example, saw dicing, laser singulation, reactive ion etching (RIE), wet etching or any suitable combination of these singulation steps. Regardless of the singulation step, the protective layer and singulation particulates can be cleaned off from the singulated dies and from the dicing frame. The bonding surfaces of the cleaned dies may ashed to remove unwanted organic residues and cleaned for direct bonding to another prepared bonding surface of another substrate. In some embodiments, the cleaned bonding surface of the singulated dies may be activated by known methods, cleaned of unwanted particles and material prior to directly bonding the bonding surfaces of the activated die to another prepared bonding surface of a second substrate. The bonded elements can be annealed to mechanically and electrically interconnect the opposing conductive pads of the bonded substrates (see FIG. 2I). In some embodiments, the second substrate with bonded singulated dies may further be singulated to form directly bonded die stacks.

Sizes of the grains 24 in the element 1 can vary. In some embodiments, the grains 24 at or near the upper side 14b can be smaller on average than the grains 24 at or near the lower side 14a. In some embodiments, the grains can have a small grain region at or near the upper side 14b of the conductive pad 14 and a large grain region at or near the lower side 14a of the conductive pad 14. In some embodiments, the small grain region can be a region of the conductive pad 14 from the upper side 14b to 1000 nm, or to 3000 nm for a deeper pad, into the conductive pad 14. In some embodiments, an average size of the grains 24 in the small grain region at or near the upper side 14b can be about 10 nanometers (nm) to 200 nm, or about 30 nm to 200 nm. In some embodiments, an average size of the grain 24 in the large grain region at or near the lower side 14a can be about 0.2 microns (μm) to 1 μm, or 0.2 μm to 0.5 μm. In some embodiments, the average size of the grain 24 at or near the lower side 14a can be at least five times greater than the average size of the grains 24 at or near the upper side 14b. For example, the average size of the grain 24 at or near the lower side 14a can be about 10 to 100, 20 to 100, 30 to 100, 40 to 100, or 40 to 100, times greater than the average size of the grains 24 at or near the upper side 14b. In some embodiments, the grains 24 can have gradient grain sizes. For example, the grain sizes of the grains 24 can gradually increase from the upper side 14b to the lower side 14a. In some embodiments, the conductive pad 14 can be harder at or near the upper side 14b than at or near the lower side 14a. In some embodiments, the cold working of the conductive pad 14 is sufficiently deep such that an average size of the smaller grains at or near the upper surface 14b is similar to an average size of the grains at or near lower side 14a or at the interior of the cavity.

In FIG. 2H, the element 1 is brought into contact with the second element 2. In some embodiments, the second element can comprise an identical or generally similar element as the element 1. In some embodiments, the second element 2 can comprise a carrier, such as a package substrate, an interposer, a reconstituted wafer or element, etc. In some embodiments, the second element 2 can also be prepared for direct bonding as in element 1. A dashed line shown in FIG. 2H indicates a bond interface 56 between the element 1 and the second element 2. The second element 2 can include a second substrate 50, a second dielectric layer 52, and a second conductive pad 54. The conductive pad 54 can have grains 64. In some embodiments, upon contacting the dielectric layer 12 and the second dielectric layer 52, the dielectric layers 12 and 52 can bond to one another. In some embodiments, the dielectric layer 12 and the second dielectric layer 52 can be bonded to one another directly without an intervening adhesive. The dielectric layer 12 and the second dielectric layer 52 can be directly bonded at room temperature without external pressure. Although not shown in FIG. 2H, the conductive pads 14, 54 can be recessed from the surfaces of the dielectric layers 12, 52, respectively, at the time of contact, such that a small gap is present between the opposing bond pads 14, 54 or other conductive elements at the surface.

In FIG. 2I, the conductive pad 14 and the second conductive pad 54 are bonded to one another. In some embodiments, the conductive pad 14 and the second conductive pad 54 can be bonded to one another directly without an intervening adhesive. The bonded structure can be annealed. Upon annealing, the conductive pads 14, 54 can expand and contact one another to form a metal-to-metal direct bond. A dashed line shown in FIG. 2I indicates the bond interface 56 between the element 1 and the second element 2.

As described above, prior to anneal, the crystal structure of the conductive material 32 can have grains 24 including a lower percentage of vertically oriented 111 crystal planes near the interface, as compared to the bottom regions of the conductive pads 14, 54. The conductive pad 14 after the cold work process in FIGS. 2G and 2H has stored energy in the cold worked conductive pad 14. The cold worked conductive pad 14 may comprise very fine non-oriented grain sizes (with massive lattice imperfections, high angle grain boundaries, twins, dislocations, vacancies etc.) exhibiting high creep in the pad 14. The combination of higher creep and grain stored energy can enable the bridging of the recess between the pads 14 and 54. at relatively low temperature annealing. Therefore, the conductive pads 14, 54 can be sufficiently bonded to one another directly with a relatively low temperature and/or short anneal. In some embodiments, the conductive pad 14 and the second conductive pads 54 can be annealed at a temperature less than 250° C., less than 200° C., or less than 150° C., for example about 100° C. to 250° C., about 125° C. to 200° C., or about 125° C. to 180° C.

After the conductive pad 14 and the second conductive pad 54 are annealed and bonded, the grain sizes can change relative to before bonding. In some embodiments, a size of a grain 24, 64 at or near the bonding interface 56 can be on average more than about 1.2 or 2 times larger than a size of a grain 24 at or near the lower side 14a of the conductive pad 14. For example, the size of a grain 24, 64 at or near the bonding interface 56 can be on average more than about 2 to 10, 2 to 7, 2 to 5, 1.2 to 10, 1.2 to 7, or 1.2 to 5 times larger than a size of a grain 24 at or near the lower side 14a of the conductive pad 14. In some embodiment, a grain size of the grain 24, 64 at or near the bonding interface 56 may be at least 20% to 50% larger than a grain size of the grain 24 at or near the lower side 14a of the conductive pad 14.

In some embodiments, an average dimension of the grains 24, 64 at the bonding interface 56 is about 3 to 8 times, 3 to 6 times, 4 to 8 times, or 4 to 6 times greater than an average dimension of the grains 24 closer to the lower side 14a of the conductive pad 14. In some embodiments, the grains 24, 64 at or near the bonding interface of the bonded conductive pads 14, 54 can have a higher percentage of 111 planes and annealing twins than that of the grains 24 at or near the lower side 14a of the conductive pad 14. The stored energy in the surface grain structure facilitates greater grain growth and re-orientation during the anneal for bonding, as compared to deeper parts of the pad structure that are less affected by the cold working process.

FIGS. 3A-3G show steps in a manufacturing process for forming the element 1 illustrated in FIG. 1, according to another embodiment. The process illustrated in FIGS. 3A-3G is different from the process illustrated in FIGS. 2A-2G in that the conductive material 32 is thinned prior to peening in the process illustrated in FIGS. 2A-2G. The components shown in FIGS. 3A-3G can be the same as or generally similar to like components shown in FIGS. 1-2I, and like reference numerals are used to refer to like parts.

Figure 3A:
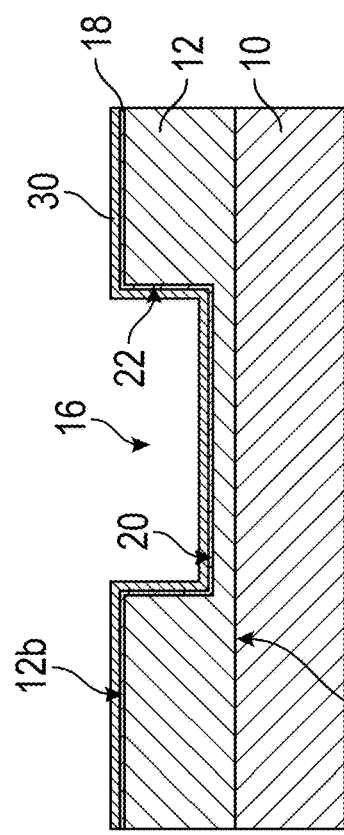
FIG. 3A shows a step in another manufacturing process for forming the element illustrated in FIG. 1, according to an embodiment.

In FIG. 3A, a dielectric layer 12 is provided over a substrate 10. A cavity 16 is formed in the dielectric layer 12. The cavity 16 can extend through at least a portion of a thickness of the dielectric layer 12. The cavity 16 can be formed by way of selective etching or drilling. The cavity 16 can comprise a damascene cavity that is formed with damascene processes. In FIG. 3A, an insulating or conductive barrier layer 18 can be provided on an upper side 12b of the dielectric layer 12, sidewalls 22 of the cavity 16, and the bottom side 20 of the cavity 16. A seed layer 30 can be provided on the barrier layer 18 over the same surfaces.

Figure 3B:
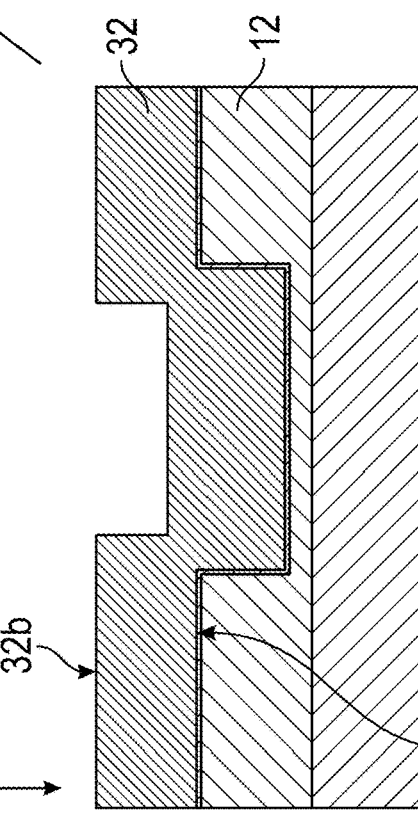
FIG. 3B shows another step in the manufacturing process for forming the element illustrated in FIG. 1.
Figure 3C:
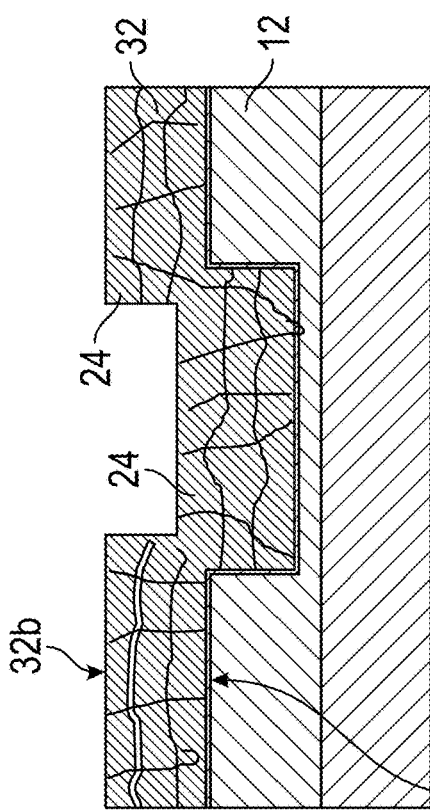
FIG. 3C shows another step in the manufacturing process for forming the element illustrated in FIG. 1.

In FIG. 3B, a conductive material 32 can be provided in the cavity 16 and over the upper side 12b of the dielectric layer 12. In some embodiments, the conductive material can comprise metal, such as copper (Cu). The conductive material 32 can have a lower side 32a and an upper side 32b. As shown in FIG. 3C, the conductive material 32 can be annealed. The annealing process can stabilize the microstructure (e.g., grain structure) of grains 24 in the conductive material 32. The annealing process can form relatively large grains in the conductive material 32.

Figure 3D:
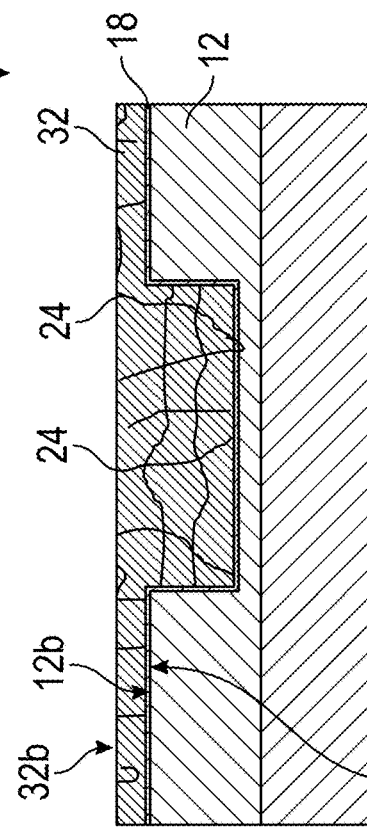
FIG. 3D shows another step in the manufacturing process for forming the element illustrated in FIG. 1.

In FIG. 3D, the conductive material 32 can be thinned from the upper side 32b. In some embodiments, the conductive material 32 can be thinned by way of polishing, such as chemical mechanical polishing (CMP). FIG. 3D illustrates that a portion of the conductive material 32 is disposed on the upper side 12b of the dielectric layer 12. However, in some embodiments, the conductive material 32 positioned over the upper side 12b of the dielectric layer 12 can be removed completely and expose the barrier layer 18. In some other embodiments, the barrier layer 18 over the upper side 12b of the dielectric layer 12 can be removed completely and expose the upper side 12b of the dielectric layer 12.

In FIG. 3E, the conductive material 32 can be treated with a cold work process as described above with respect to FIG. 2E. The cold work process can take place at room temperature and/or below room temperature. For example, the substrate temperature during the cold work process may range from −196° C. (77K), the temperature of liquid nitrogen, to about 50° C., or from 0° C. to about 25° C., and in one example at about ambient clean room temperature. The conductive material 32 can be treated from the upper side 32b. In some embodiments, the conductive material 21 can be treated with a strain hardening process. For example, the conductive material 32 can be treated by a shot peening process or laser peening process to induce plastic deformation in the conductive material 32. As noted above, shot peening can include bombardment by particles, such as metal, sand, glass, or ceramic. The plastic deformation can induce residual compressive stresses in the grains 24 at a surface and below surface of the conductive material 32 and/or tensile stresses at an interior of the conductive material 32. As discussed herein, regardless of the method of applying compressive force or forces to the conductive material 32, the applied force should degrade the substrate 1. Degrading the element 1 may, for example, comprise applying excessive force so as to induce delamination of the barrier layer 18 for the surface of the substrate or induce defects or cracks in the dielectric layer 12 and/or the substrate 10.

FIG. 3F shows the grains 24 after the treatment in FIG. 3E. Sizes of the grains 24 in the conductive material 32 can vary. In some embodiments, the grains 24 at or near the upper side 32b can be smaller than the grains 24 at or near the lower side 32a. In some embodiments, an average size of the grains 24 at or near the upper side 32b can be about 5 nanometers (nm) to 200 nm, or about 30 nm to 200 nm. Depending upon the thickness of remaining metal over field regions (upper surface of the dielectric layer 12), an average size of the grain 24 at or near the lower side 32a can be about 0.5 microns (μm) to 3 μm or larger. In some embodiments, the average size of the grain 24 at or near the lower side 32a or in the regions of the bottom of the conductive pad can be at least about two times greater than the average size of the grains 24 at or near the upper side 32b to the average size of the grain 24 at or near the lower side 32a. For example, the average size of the grain 24 at or near the lower side 32a can be about 2 to 100, 20 to 100, 30 to 100, 40 to 100, or 40 to 100, times greater than the average size of the grains 24 at or near the upper side 32b. In some embodiments, the grains 24 can have 1 gradient grain sizes. For example, the grain sizes of the grains 24 can gradually increase from the upper side 32b to the lower side 32a. In some embodiments, the conductive material 32 can be harder at or near the upper side 32b than at or near the lower side 32a. Due to the plastic deformation, reduced grain sizes, increased lattice imperfections and a reduced percentage of 111 oriented crystal planes are left at or near the upper side 32b of the conductive pad 32. In some embodiments, due to the reduced thickness of the metal left by the planarization shown in FIG. 3E, the plastic deformation may extend from the upper side 32b of the conductive pad 32 to the lower side 32a of the conductive pads 32.

In FIG. 3G, the element 1 is formed. At least a portion of the conductive material 32 can be removed. Portions of the barrier layer 18 and the seed layer 30 can also be removed to form a highly polished planar bonding surface. A portion of the dielectric layer 12 can also be removed. In some embodiments, the portions of the conductive material, barrier layer 18, seed layer 30, and the dielectric layer 12 can be removed by polishing, such as chemical mechanical polishing (CMP) in one or multiple stages to form a highly polished bonding surface. The bonding surface comprising a planar top surface of the dielectric layer 12 and a planar polished surface of the conductive pad 14. The upper side 12b of the dielectric layer 12 can be polished to a high degree of smoothness and can be activated to prepare for direct bonding.

As described above with respect to FIGS. 2H and 2I, the structure shown in FIG. 3G can then be directly hybrid bonded to another element, which may or may not have received similar treatment. As also noted above with respect to FIGS. 2H and 2I, the prepared bonding surface can first be protected with a protective layer, such as an organic resist layer, for intervening singulation or other processing prior to bonding.

The conductive pad 14 after the cold work process in FIGS. 2E and 3E have stored energy in conductive pad 14. The stored energy can enable a relatively low temperature annealing for bonding the element (the first element 1) to another element (the second element 2). The conductive pads 14, 54 can be directly bonded to one another sufficiently with a relatively low temperature and/or a relatively short anneal duration. In some embodiments, the conductive pad 14 and the second conductive pad 54 can be annealed at a temperature less than 250° C., less than 200° C., or less than 150° C., for example about 100° C. to 250° C., or about 125° C. to 180° C.

After the conductive pad 14 and the second conductive pad 54 are annealed and bonded, the grain sizes can change relative to the grain sizes before bonding. In some embodiments, a size of a grain 24, 64 at or near the bonding interface 56 can be on average more than about 1.2 or 2 times larger than a size of a grain 24 at or near the lower side 14a of the conductive pad 14. For example, the size of a grain 24, 64 at or near the bonding interface can be on average more than about 2 to 10, 2 to 7, 2 to 5, 1.2 to 10, 1.2 to 7, or 1.2 to 5 times larger than a size of a grain 24, 64 at or near the lower side of the conductive pad 14, 54. In some embodiment, a grain size of the grain 24, 64 at or near the bonding interface may be at least 20% to 50% larger than a grain size of the grain 24, 64 at or near the lower side of the conductive pad 14, 54. In general, the larger the stored energy from the applied compressive force, the larger the grain size in the annealed bonded conductive pads.

In some embodiments, a third conductive material (not shown) may be disposed in a cavity 16 in the dielectric material 12, beneath the barrier layer 18 (see FIGS. 2B and 3A) as typical in multilayer BEOL or redistribution layer (RDL) within the element 1. After the bonding and annealing operation(s), as a result of the mechanical and thermal treatment(s) to the conductive material 32 in the cavity 16, an average size of the grain 24 in the regions of the conductive pad 32 of cavity 16 can be at least about 20% greater than the average size of the grains 24 of the third conductive material beneath the barrier layer 18 compared to a third conductive material that was exposed to only thermal treatment. For example, the average size of the grain 24 of conductive pad 32 can be about 1.2 to 20 times greater than the average size of the grains 24 of the third conductive material beneath the barrier layer 18 or subsequent conductive pads (not shown) beneath the third conductive pads.

Referring back to FIG. 2I, in some embodiment, after annealing the mechanically or optically cold worked conductive material, the annealed grains are elongated along a direction generally parallel to the dielectric bonding surface or the bonding surface of the conductive material. A horizontal dimension (length l) of a grain of the annealed conductive material 24 may be at least 20% larger than a vertical dimension (thickness t) of the same grain about a direction perpendicular to the dielectric bonding surface or the bonding surface of the conductive material. For example, the length of a grain of the conductive material generally parallel to the bonding interface can be, on average, more than about 1.5 to 10 times larger than the thickness of the grain in a direction generally perpendicular to the bonding interface. In some embodiment, the length of the columnar grain a bonded elements (e.g., the bonded elements 3 shown in FIG. 2I) may be at least 20% to 300% longer than the thickness of columnar grain of the conductive material in bonded element 3. In some embodiments, an aspect ratio of a grain (the maximum longitudinal dimension (length l) of a grain/the maximum perpendicular dimension (thickness t) of the same grain), can be greater than 1.2, 1.5, or 3.

In one aspect, an element is disclosed. The element can include a non-conductive structure that has a non-conductive bonding surface, a cavity that at least partially extends through a portion of a thickness of the non-conductive structure from the non-conductive bonding surface, and a conductive pad that is disposed in the cavity. The cavity has a bottom side and a sidewall. The conductive pad has a bonding surface and a back side opposite the bonding surface. An average size of the grains at the bonding surface is smaller than an average size of the grains that are adjacent the bottom side of the cavity.

In one embodiment, the non-conductive structure includes a dielectric layer. The non-conductive bonding surface of the non-conductive layer can be prepared for direct bonding.

The conductive bonding surface of the conductive pad can be prepared for direct bonding.

The conductive pad comprises can be a copper (Cu) pad.

The conductive pad can include a lower percentage of grains with 111 crystal planes at the bonding surface compared with adjacent to the bottom side.

The conductive pad can include a higher percentage of grains with 220 crystal planes at the bonding surface compared with adjacent to the bottom side In one embodiment, the average size of the grains adjacent the bottom side of the cavity is at least 3 times greater than the average size of the grains at the bonding surface.

In one embodiment, the average size of the grains adjacent the bottom side of the cavity is at least 20 times greater than the average size of the grains at the bonding surface.

In one embodiment, the average size of the grains adjacent the bottom side of the cavity is between 0.2 microns (μm) to 1 μm.

In one embodiment, the average size of the grains at the bonding surface is between 30 nanometer (nm) to 200 nm.

In one embodiment, the element further includes a barrier layer disposed between the non-conductive layer and the conductive pad.

In one aspect, a bonded structure is disclosed. The bonded structure can include a first element that includes a non-conductive structure that has a non-conductive bonding surface, a cavity that extends at least partially through a thickness of the non-conductive structure from the non-conductive bonding surface, and a conductive pad that is disposed in the cavity. The cavity has a bottom side and a sidewall. The conductive pad has a bonding surface and a back side opposite the bonding surface. An average size of the grains at the bonding interface is at least 20% greater than an average size of the grains adjacent the bottom side of the cavity. The bonded structure can include a second element that has a second conductive pad. The conductive pad of the first element and the second conductive pad of the second element are directly bonded to one another without an intervening adhesive along a bonding interface.

In one embodiment, the second element further includes a second non-conductive structure that has a second non-conductive bonding surface that is directly bonded to the non-conductive bonding surface of the first element without an intervening adhesive.

In one embodiment, an average size of the grains at the bonding interface is at least 50% greater than an average size of the grains closer to the back side.

In one embodiment, an average size of the grains at the bonding interface is at least two times greater than an average size of the grains adjacent the bottom side of the cavity.

An average size of the grains at the bonding interface can be at least three times greater than an average size of the grains adjacent the bottom side of the cavity.

In one aspect, a method for forming an element is disclosed. The method can include providing a non-conductive structure that has a first side and a second side opposite the first side. The method can include forming a cavity in the non-conductive structure. The method can include providing a conductive material in the cavity and on a portion of the first side of the non-conductive layer. The conductive material has a lower side facing a bottom side of the cavity and an upper side opposite the lower side. The method can include cold working the upper side of the conductive material to modify a grain structure of the conductive material. The cold working is conducted between about −196° C. and 50° C. The method can include removing at least a portion of the conductive material to define a conductive pad that has a conductive bonding surface.

In one embodiment, the cold working includes mechanical peening or laser peening.

In one embodiment, the cold working includes bombarding the upper side of the conductive material with metal particles, glass particles, or ceramic particles.

In one embodiment, the cold working includes decreasing a percentage of 111 crystal planes in the conductive material.

The cold working includes inducing plastic deformation in the conductive material, and causing grain sizes of the conductive material at least at the upper side to be reduced compared to prior to the cold working.

In one embodiment, the cold working produces smaller grains sizes at the upper side of the conductive material compared to at the lower side of the conductive material.

In one embodiment, the method further includes annealing the conductive material to stabilize grain sizes of the conductive material prior to cold working.

In one embodiment, the removing includes at least partially removing the portion of the conductive material prior to cold working.

The method can further include preparing the conductive bonding surface of the conductive pad and the first side of the non-conductive structure for direct bonding.

In one embodiment, the method further includes providing a barrier layer between the non-conductive structure and the conductive material.

In one embodiment, a method for forming a bonded structure includes bonding the element to a second element having a second non-conductive structure and a second conductive pad.

The bonding can include directly bonding the non-conductive structure and the second non-conductive structure.

The bonding can further include annealing the conductive pad and the second conductive pad at a temperature between 50° C. and 250° C.

The annealing can include annealing the conductive pad and the second conductive pad at a temperature between 50° C. and 150° C.

The annealing the conductive pad and the second conductive pad can cause an average grain size of the conductive material at the upper side to be larger as compared to prior to the annealing.

The annealing the conductive pad and the second conductive pad can cause an average grain size of the conductive material at the upper side to be larger than an average grain size of the conductive material at the lower side.

In one aspect, an element is disclosed. The element can include a non-conductive structure that has a non-conductive bonding surface, a cavity that at least partially extends through a portion of a thickness of the non-conductive structure from the non-conductive bonding surface, and a conductive pad that is disposed in the cavity. The cavity has a bottom side and a sidewall. The conductive pad has a bonding surface and a back side opposite the bonding surface. The conductive pad includes a lower percentage of grains with vertically oriented 111 crystal planes at the bonding surface as compared with grains adjacent to the bottom side.

In one aspect, an element is disclosed. The element can include a non-conductive structure that has a non-conductive bonding surface, a cavity that at least partially extends through a portion of a thickness of the non-conductive structure from the non-conductive bonding surface, and a conductive feature that is disposed in the cavity. The cavity has a bottom side and a sidewall. The conductive feature has a bonding surface and a back side opposite the bonding surface. An average size of grains in a portion of the conductive feature near the bonding surface is less than 200 nanometer (nm).

In one embodiment, the average size of the grains in the portion of the conductive feature near the bonding surface is at least 50 nm.

In one aspect, a bonded structure is disclosed. The bonded structure can include a first element that includes a non-conductive structure that has a non-conductive bonding surface, a cavity that extends at least partially through a thickness of the non-conductive structure from the non-conductive bonding surface, and a conductive pad that is disposed in the cavity. The cavity has a bottom side and a sidewall. The conductive pad has a bonding surface and a back side opposite the bonding surface. The conductive pad includes a crystal structure with grains oriented along a 111 crystal plane. An average grain size of the conductive pad at the bonding surface is greater than an average grain size of the conductive pad at the back side. The bonded structure can include a second element that has a second conductive pad. The conductive pad of the first element and the second conductive pad of the second element are directly bonded to one another without an intervening adhesive along a bonding interface.

In one aspect, a method for forming an element is disclosed. the method can include providing a non-conductive structure that has a first side and a second side opposite the first side. The method can include forming a cavity in the first side of the non-conductive structure. The method can include providing a conductive material in the cavity and over the first side of the non-conductive structure. The method can include increasing a grain size of the conductive material by thermal annealing. The method can include forming lattice imperfections in the annealed conductive material. The method can include forming a planar bonding surface comprising a non-conductive bonding surface and a conductive bonding surface. The conductive bonding surface includes the lattice imperfections.

In one embodiment, the method further includes providing a barrier layer between the non-conductive structure and the conductive material.

In one embodiment, the method further includes singulating the element on a dicing frame.

The method can further include providing a protective layer over the element and further cleaning off the protective layer particles from singulation from the bonding surface of the singulated element and the dicing frame.

The method can further include directly bonding a cleaned singulated element to a prepared bonding surface of a second substrate to form a bonded structure.

The method can further include annealing the bonded structure at a temperature below 200° C. to electrically bond the singulated element to the second substrate.

In one embodiment, the forming the lattice imperfections comprises cold working a surface of the annealed conductive material.

In one aspect, a bonded structure is disclosed. The bonded structure can include a first element that includes a non-conductive structure that has a non-conductive bonding surface, a cavity extending at least partially through a thickness of the nonconductive structure from the non-conductive bonding surface, and a conductive pad that is disposed in the cavity. The cavity has a bottom side and a sidewall. The conductive pad has a bonding surface and a back side opposite the bonding surface. The conductive pad includes a longitudinal columnar grain structure oriented generally parallel to the non-conductive bonding surface. The bonded structure can include a second element that has a second conductive pad. The conductive pad of the first element and the second conductive pad of the second element are directly bonded to one another without an intervening adhesive along a bonding interface.

In one aspect, a bonded structure is disclosed. the bonded structure can include a first element that includes a planar conductive structure embedded in the surface of a non-conductive material that has a non-conductive bonding surface. The conductive structure has a longitudinal columnar grain structure oriented generally parallel to the non-conductive bonding surface. The bonded structure can include a second element that has a planar bonding surface. The bonding surface of the first element and the second element are directly bonded to one another without an intervening adhesive along a bonding interface.

In one aspect, a bonded structure is disclosed. The bonded structure can include a first element that includes a first conductive feature and a first non-conductive region. the bonded structure can include a second element that includes a second conductive feature that is directly bonded to the first conductive feature without an intervening adhesive and a second non-conductive region that is bonded to the first non-conductive region. The bonded first and second conductive features include grains. Each grain of the grains has a length along an bonding interface between the first and second element and a thickness perpendicular to the bonding interface. The grains have an average length that is at least 1.5 times larger than an average thickness of the grains.

[0069] Unless the context clearly requires otherwise, throughout the description and the claims, the words "comprise," "comprising," "include," "including" and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Moreover, as used herein, when a first element is described as being "on" or "over" a second element, the first element may be directly on or over the second element, such that the first and second elements directly contact, or the first element may be indirectly on or over the second element such that one or more elements intervene between the first and second elements. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments.

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. Any suitable combination of the elements and acts of the various embodiments described above can be combined to provide further embodiments. The accompanying claims and their equivalents are intended to cover such forms or modifications as would fall within the scope and spirit of the disclosure.

What is claimed is:

1. An element comprising:
   a non-conductive structure having a non-conductive bonding surface;
   a cavity at least partially extending through a portion of a thickness of the non-conductive structure from the non-conductive bonding surface, the cavity having a bottom side and a sidewall; and
   a conductive pad disposed in the cavity, the conductive pad having a bonding surface and a back side opposite the bonding surface, wherein the bonding surface of the conductive pad is recessed below the non-conductive bonding surface and wherein_an average size of grains of the conductive pad at the bonding surface being smaller than an average size of the grains adjacent the bottom side of the cavity.

2. The element of claim 1, wherein the non-conductive structure comprises a dielectric layer, and the non-conductive bonding surface of the non-conductive structure is prepared for direct bonding.

3. The element of claim 2, wherein the conductive pad is a copper (Cu) pad.

4. The element of claim 3, wherein the conductive pad includes a lower percentage of grains with vertically-oriented 111 crystal planes at the bonding surface compared with adjacent to the bottom side.

5. The element of claim 3, wherein the conductive pad includes a higher percentage of grains with vertically-oriented 220 crystal planes at the bonding surface compared with adjacent to the bottom side.

6. The element of claim 1, wherein the average size of the grains adjacent the bottom side of the cavity is at least 3 times greater than the average size of the grains at the bonding surface.

7. The element of claim 1, wherein the average size of the grains adjacent the bottom side of the cavity is at least 20 times greater than the average size of the grains at the bonding surface.

8. The element of claim 1, wherein the average size of the grains adjacent the bottom side of the cavity is between 0.2 microns (μm) to 1 μm.

9. The element of claim 1, wherein the average size of the grains at the bonding surface is between 30 nanometer (nm) to 200 nm.

10. The element of claim 1, further comprising a barrier layer disposed between the non-conductive structure and the conductive pad.

11. A bonded structure comprising:
    a first element including;
       a non-conductive structure having a non-conductive bonding surface;
       a cavity extending at least partially through a thickness of the non-conductive structure from the non-conductive bonding surface, the cavity having a bottom side and a sidewall; and
       a conductive pad disposed in the cavity, the conductive pad having a bonding surface and a back side opposite the bonding surface, wherein an average size of grains of the conductive pad at the bonding surface is different than an average size of the grains adjacent the bottom side of the cavity; and
    a second element having a second conductive pad,
    wherein the conductive pad of the first element and the second conductive pad of the second element are directly bonded to one another without an intervening adhesive along a bonding interface, wherein the second element comprises a second non-conductive bonding surface, wherein the non-conductive bonding surface is directly bonded to the second non-conductive bonding surface, and wherein at least one of the non-conductive bonding surface and the second non-conductive bonding surface comprises an activated bonding surface.

12. The bonded structure of claim 11, wherein the second non-conductive bonding surface is directly bonded to the non-conductive bonding surface without an intervening adhesive.

13. The bonded structure of claim 11, wherein the average size of the grains at the bonding interface is at least 50% greater than the average size of the grains adjacent the bottom side of the cavity.

14. The bonded structure of claim 11, wherein the average size of the grains at the bonding interface is at least two times greater than the average size of the grains adjacent the bottom side of the cavity.

15. The bonded structure of claim 14, wherein the average size of the grains at the bonding interface is at least three times greater than the average size of the grains adjacent the bottom side of the cavity.

16. The bonded structure of claim 11, wherein the average size of the grains of the conductive pad at the bonding surface is at least 20% different than the average size of the grains adjacent the bottom side of the cavity.

17. The bonded structure of claim 16, wherein the average size of the grains of the conductive pad at the bonding surface is at least 20% greater than the average size of the grains adjacent the bottom side of the cavity.

18. The bonded structure of claim 11, wherein the activated bonding surface comprises a plasma-activated bonding surface.

19. The bonded structure of claim 11, wherein the activated bonding surface comprises an amount of nitrogen that is indicative of nitrogen termination.

20. The bonded structure of claim 11, wherein the activated bonding surface comprises a nitrogen-terminated inorganic non-conductive material.

21. The bonded structure of claim 11, wherein the non-conductive bonding surface is directly bonded to the second non-conductive bonding surface with a covalent bond.

22. A method for forming an element, the method comprising:
    providing a non-conductive structure having a first side and a second side opposite the first side;
    forming a cavity in the non-conductive structure;
    providing a conductive material in the cavity and on a portion of the first side of the non-conductive structure, the conductive material having a lower side facing a bottom side of the cavity and an upper side opposite the lower side;
    cold working the upper side of the conductive material to modify a grain structure of the conductive material, wherein the cold working is conducted between about −196° C. and 50° C.; and
    removing at least a portion of the conductive material to define a conductive pad having a conductive bonding surface.

23. The method of claim 22, wherein the cold working comprises mechanical peening or laser peening.

24. The method of claim 22, wherein the cold working comprises bombarding the upper side of the conductive material with metal particles, glass particles, or ceramic particles.

25. The method of claim 22, wherein the cold working comprises decreasing a percentage of 111 crystal planes in the conductive material.

26. The method of claim 25, wherein the cold working comprises inducing plastic deformation in the conductive material, and causing grain sizes of the conductive material at least at the upper side to be reduced compared to prior to the cold working.

27. The method of claim 22, wherein the cold working produces smaller grains sizes at the upper side of the conductive material compared to at the lower side of the conductive material.

28. The method of claim 22, further comprising annealing the conductive material to stabilize grain sizes of the conductive material prior to cold working.

29. The method of claim 22, further comprising preparing the conductive bonding surface of the conductive pad and the first side of the non-conductive structure for direct bonding.

30. A method for forming a bonded structure, the method comprising bonding the element of claim 22 to a second element having a second non-conductive structure and a second conductive pad.

31. The method of claim 30, wherein the bonding comprises directly bonding the non-conductive structure and the second non-conductive structure.

32. The method of claim 31, wherein the bonding further comprises annealing the conductive pad and the second conductive pad at a temperature between 50°° C. and 250° C.

33. The method of claim 32, wherein annealing the conductive pad and the second conductive pad causes an average grain size of the conductive material at the upper side to be larger as compared to prior to the annealing.

\* \* \* \* \*